(12) United States Patent
Kim et al.

(10) Patent No.: US 11,800,770 B2
(45) Date of Patent: Oct. 24, 2023

(54) DISPLAY DEVICE

(71) Applicant: Samsung Display Co., Ltd., Yongin-si (KR)

(72) Inventors: Hwi Kim, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 490 days.

(21) Appl. No.: 16/816,257

(22) Filed: Mar. 12, 2020

(65) Prior Publication Data

US 2021/0013275 A1 Jan. 14, 2021

(30) Foreign Application Priority Data

Jul. 10, 2019 (KR) .................. 10-2019-0083434

(51) Int. Cl.
*H01L 51/52* (2006.01)
*H10K 59/35* (2023.01)
*H10K 59/122* (2023.01)

(52) U.S. Cl.
CPC ......... *H10K 59/353* (2023.02); *H10K 59/122* (2023.02); *H10K 59/352* (2023.02)

(58) Field of Classification Search
None
See application file for complete search history.

(56) References Cited

U.S. PATENT DOCUMENTS

| 10,199,437 | B2 | 2/2019 | Kim | |
|---|---|---|---|---|
| 11,066,742 | B2 | 7/2021 | Yamabuchi et al. | |
| 2017/0025478 | A1* | 1/2017 | Wehlus | H01L 27/3209 |
| 2017/0317145 | A1 | 11/2017 | Hong et al. | |
| 2019/0096976 | A1* | 3/2019 | Jang | H01L 33/06 |
| 2020/0385856 | A1* | 12/2020 | Yamabuchi | C23C 14/042 |
| 2021/0280646 | A1* | 9/2021 | Zhang | H01L 51/5237 |

FOREIGN PATENT DOCUMENTS

| CN | 107236927 | | 10/2017 | |
|---|---|---|---|---|
| KR | 10-2013-0026628 | | 3/2013 | |
| KR | 20140034500 | A * | 10/2014 | G09G 3/20 |
| KR | 10-2018-0115387 | | 10/2018 | |
| KR | 10-2018-0124812 | | 11/2018 | |
| WO | 2019/064420 | | 4/2019 | |

* cited by examiner

*Primary Examiner* — Nilufa Rahim

(74) *Attorney, Agent, or Firm* — H.C. Park & Associates, PLC

(57) ABSTRACT

A display device includes: a substrate including a display area and a non-display area; and a plurality of sub-pixels arranged in the display area and including portions of an electrode disposed over the display area. The plurality of sub-pixels includes a first sub-pixel and a second sub-pixel to emit light of the same color, a first portion of the electrode of the first sub-pixel has a thickness different from a thickness of a second portion of the electrode of the second sub-pixel, and the first sub-pixel has a size different from a size of the second sub-pixel.

20 Claims, 15 Drawing Sheets

DISPLAY DEVICE

CROSS REFERENCE TO RELATED APPLICATION

This application claims priority from and the benefit of Korean Patent Application No. 10-2019-0083434, filed on Jul. 10, 2019, which is incorporated by reference for all purposes as if fully set forth herein.

BACKGROUND

Field

Exemplary implementations of the invention generally relate to a display device and, more specifically, to a display device including a plurality of sub-pixels.

Discussion of the Background

Recently, the usage of display devices has diversified. Also, as display devices have become thinner and more lightweight, their range of use has gradually widened.

As display devices are used in various ways, the shapes of display devices may be designed in various ways. Also, functions that may be combined or associated with display devices are increasing. For example, display devices often include pinch holes to accommodate cameras, infrared sensors or the like.

The above information disclosed in this Background section is only for understanding of the background of the inventive concepts, and, therefore, it may contain information that does not constitute prior art.

SUMMARY

Applicant discovered that display devices having sub-pixels may have different size sub-pixels due to a variety of reasons, such as incorporation of pinch holes, and the variation in sub-pixel size can result in deviations and non-uniformity of brightness between the sub-pixels.

Display devices constructed according to the principles and exemplary implementations of the invention are capable of minimizing or at least reducing the brightness deviation between pixels. For example, a display device constructed according to the principles and exemplary implementations of the invention includes sub-pixels having different sizes depending on the thicknesses of their conductive layers, such as opposite electrodes, to minimize or at least reduce the brightness deviation. Sizing of the sub-pixels in accordance with the principles of the invention may also reduce deterioration of the light-emitting elements, such as organic light-emitting diodes and improve their useful lifetime.

Display devices constructed according to the principles and exemplary implementations of the invention may include regions in which a camera, a sensor, or similar component may be arranged inside a display area to increase functions that may be combined or associated with a display device.

Additional features of the inventive concepts will be set forth in the description which follows, and in part will be apparent from the description, or may be learned by practice of the inventive concepts.

According to one aspect of the invention, a display device includes: a substrate including a display area and a non-display area; and a plurality of sub-pixels arranged in the display area and including portions of an electrode disposed over the display area, wherein the plurality of sub-pixels includes a first sub-pixel and a second sub-pixel to emit light of the same color, a first portion of the electrode of the first sub-pixel has a thickness different from a thickness of a second portion of the electrode of the second sub-pixel, and the first sub-pixel has a size different from a size of the second sub-pixel.

The display device may further include a pixel-defining layer, wherein the electrode includes an opposite electrode, the first sub-pixel and the second sub-pixel further includes pixel electrodes disposed below the opposite electrode, the pixel-defining layer covers edges of the pixel electrodes and defines openings exposing portions of the pixel electrodes, and the sizes of the first sub-pixel and the second sub-pixel are defined by the openings.

The display area may include a first area extending in a first direction, the first sub-pixel being disposed in the first area.

The display area may further include a second area, the second sub-pixel being disposed in the second area, and the first area may be arranged across the second area.

The display area may further include a second area, the second sub-pixel being disposed in the second area, and the electrode may have a thickness in the first area greater than a thickness in the second area.

The first area may further extend in a second direction intersecting the first direction, the display area may further include a second area, the second sub-pixel being disposed in the second area, and the electrode may have a thickness in the first area less than a thickness in the second area.

The non-display area may include a first non-display area and a second non-display area, the display area may surround the first non-display area, the second non-display area may surround the display area, the display area may include a first area extending in a first direction, the first sub-pixel being disposed in the first area, and the first area may be arranged between the first non-display area and the second non-display area.

The first non-display area may include a first region and a second region, and the first area may be further arranged between the first region and the second region.

The plurality of sub-pixels may include at least one red sub-pixel, at least one green sub-pixel, and at least one blue sub-pixel.

The plurality of sub-pixels may constitute virtual quadrangles, and the at least one red sub-pixel, the at least one green sub-pixel, and the at least one blue sub-pixel may be arranged at vertices of one of the virtual quadrangles.

The plurality of sub-pixels may constitute virtual quadrangles, the at least one red sub-pixel and the at least one blue sub-pixel may be arranged at vertices of one of the virtual quadrangles to face a central point of the one of the virtual quadrangles, and the at least one green sub-pixel may be arranged at the central point of the one of the virtual quadrangles.

The plurality of sub-pixels may further include a white sub-pixel, the plurality of sub-pixels may constitute virtual quadrangles, and the at least one red sub-pixel, the at least one green sub-pixel, the at least one blue sub-pixel, and the white sub-pixel may be arranged at vertices of one of the virtual quadrangles.

The red sub-pixel, the green sub-pixel, and the blue sub-pixel may be arranged generally in parallel to each other.

According to another aspect of the invention, a display device includes: a substrate including a display area and a non-display area; and a plurality of organic light-emitting diodes arranged in the display area and including portions of an electrode disposed over the display area, wherein the plurality of organic light-emitting diodes includes a first organic light-emitting diode and a second organic light-emitting diode to emit light of the same color, a first portion of the electrode of the first organic light-emitting diode has a thickness different from a thickness of a second portion of the electrode of the second organic light-emitting diode, and an emission area of the first organic light-emitting diode has a size different from a size of an emission area of the second organic light-emitting diode.

The display device may further include a pixel-defining layer, and wherein the electrode includes an opposite electrode, the plurality of organic light-emitting diodes each further includes a pixel electrode and an emission layer, the pixel-defining layer covers edges of the pixel electrodes of the plurality of organic light-emitting diodes to define openings exposing portions of the pixel electrodes, and emission areas of the plurality of organic light-emitting diodes are defined by the openings.

The display area may include a first area and a second area, the first organic light-emitting diode may be disposed in the first area, the second organic light-emitting diode may be disposed in the second area, and the first area may extend in a first direction to be arranged across the second area.

A first portion of the electrode of the first area may have a thickness greater than a thickness of a second portion of the electrode of the second area.

The first area may further extend in a second direction intersecting the first direction extending across the second area, and a first portion of the electrode of the first area may have a thickness less than a thickness of a second portion of the electrode of the second area.

The non-display area may include a first non-display area and a second non-display area, the display area may surround the first non-display area, the second non-display area may surround the display area, and the first area may be disposed between the first non-display area and the second non-display area.

The plurality of organic light-emitting diodes each may be configured to emit light having one of red, green, and blue colors, and are arranged in a pentile matrix.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
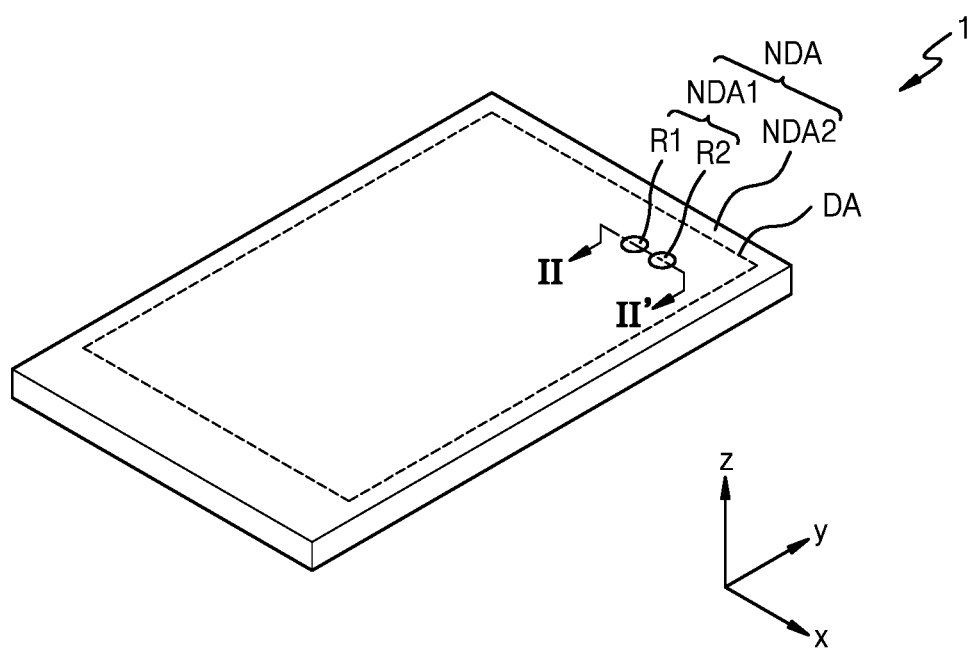
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device constructed according to the principles of the invention.

Referring to FIG. 1, a display device 1 includes a display area DA through which light is emitted, and a non-display area NDA through which light is not emitted.

The display device 1 may display an image through the display area DA. The display device 1 may be one of a liquid crystal display, an electrophoretic display, an organic light-emitting display, an inorganic light-emitting display, a quantum dot light-emitting display, a field-emission display, a surface-conduction electron-emitter display, a plasma display, a cathode ray display or other types of displays known in the art.

While the display device 1 is described as an organic light-emitting display device as an example for convenience, exemplary embodiments are not limited thereto and may be various types of display devices.

The non-display area NDA may include a first non-display area NDA1 and a second non-display area NDA2, the first non-display area NDA1 including a first region R1 and a second region R2, and the second non-display area NDA2 at least partially surrounding the display area DA. The display area DA may entirely surround the first non-display area NDA1, and the second non-display area NDA2 may entirely surround the display area DA.

The display device 1 includes the first region R1 and the second region R2. The first region R1 and the second region R2 may be locations in which an electronic element is arranged as described below with reference to FIG. 2A. The first region R1 and the second region R2 may be opening areas and/or transmission areas through which light and/or sound output from an electronic element to the outside or progressing from the outside toward the electronic element may pass. While it is shown in FIG. 1 that the opening areas or the transmission areas includes two regions R1 and R2, exemplary embodiment are not limited thereto, and one transmission area may be provided or three or more transmission areas may be provided.

In an exemplary embodiment, in the case where light passes through the first region R1 and the second region R2, the light transmittance may be 50% or more, more preferably, 70% or more, 75% or more, 80% or more, or 85% or more.

While FIG. 1 shows that the first region R1 and the second region R2 are arranged on the upper right side of the display area DA, exemplary embodiment are not limited thereto. In another exemplary embodiment, locations of the first region R1 and the second region R2 may be variously changed.

Figure 2A:
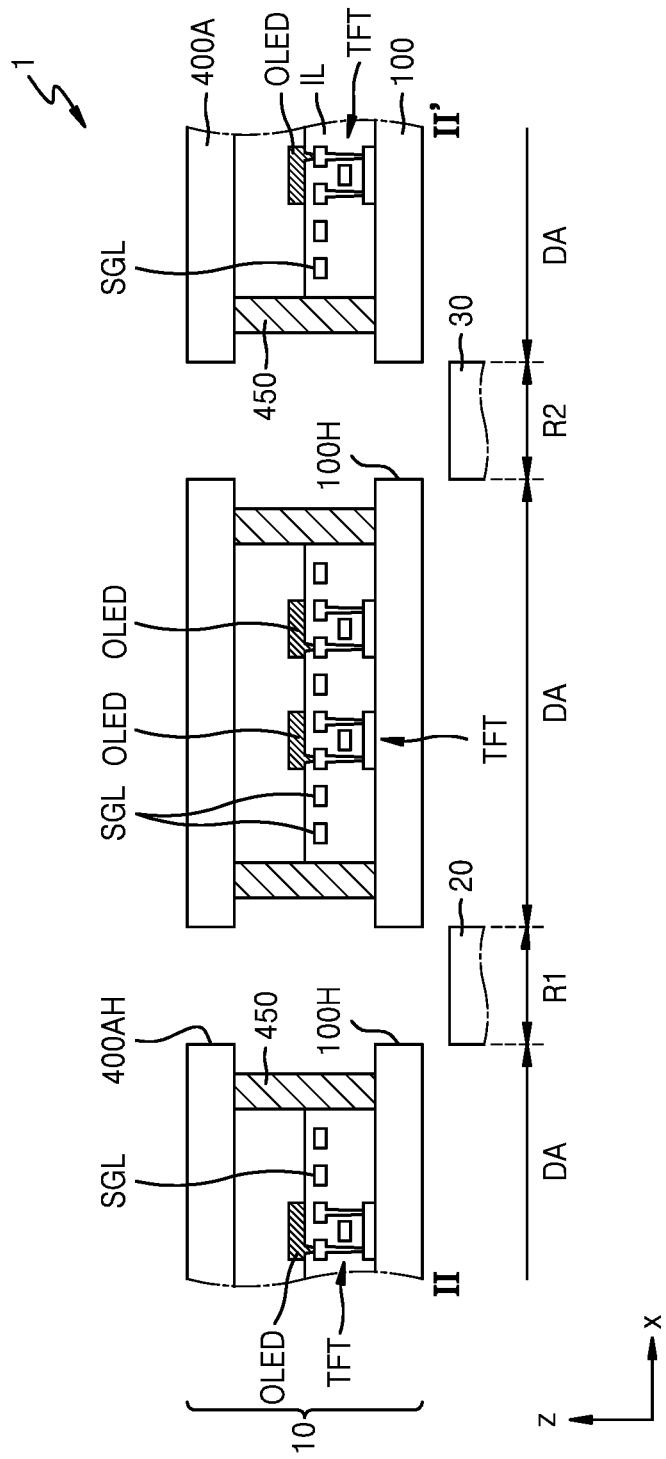
FIG. 2A is a cross-sectional view taken along line II-II' of FIG. 1 according to an exemplary embodiment.

FIG. 2A is a cross-sectional view taken along line II-II' of FIG. 1 according to an exemplary embodiment.

Referring to FIG. 2A, the display device 1 may include the display panel 10, and first and second electronic elements 20 and 30, the display panel 10 including a display element, and the first and second electronic elements 20 and 30 respectively corresponding to, i.e., overlapping, the first region R1 and the second region R2 of the display panel 10. The display device 1 may further include various elements such as an input sensing member, a reflection prevention member, and a transparent window arranged on the display panel 10, the input sensing member sensing a touch input, and the reflection prevention member including a polarizer and a retarder, or a color filter and a black matrix.

The display panel 10 may include a substrate 100, an encapsulation substrate 400A, which is an encapsulation member, and a sealing member 450 disposed therebetween, the encapsulation substrate 400A facing the substrate 100.

The substrate 100 may include glass or a polymer resin. The polymer resin may include at least one of polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including the polymer resin, and an inorganic layer. The encapsulation substrate 400A may include glass or the polymer resin.

A thin film transistor TFT, an organic light-emitting diode OLED, which is a display element, and signal lines SGL are arranged in the display area DA of the substrate 100, the organic light-emitting diode OLED being connected to the thin film transistor TFT.

The signal line SGL may provide signals (e.g. a data signal and a scan signal) to display elements apart from each other in a y-direction in the display area DA except for the first and second regions R1 and R2.

The display panel 10 may include through holes respectively corresponding to i.e., overlapping, the first and second regions R1 and R2. For example, the substrate 100 and the encapsulation substrate 400A may respectively include through holes 100H and 400AH corresponding to the first region R1 and the second region R2, and all of portions of an insulating layer IL or elements disposed between the substrate 100 and the encapsulation substrate 400A and overlapping the first region R1 and the second region R2 may be removed.

While FIG. 2A shows that a sealing member 450 is arranged on two opposite sides of each of the first and second regions R1 and R2, it may be understood that the first and second regions R1 and R2 each are entirely surrounded by the sealing member 450 when viewed in a direction perpendicular to a main surface of the substrate 100.

The first and second electronic elements 20 and 30 may be respectively located in the first and second regions R1 and R2. The first and second electronic elements 20 and 30 may be electronic elements that use light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light.

As shown in FIG. 2A, in the case where the display panel 10 includes through holes corresponding to the first and second regions R1 and R2, light or sound output from or received by the first and second electronic elements 20 and 30 may be more effectively utilized.

While FIG. 2A shows that the display panel 10 includes the through holes corresponding to the first and second regions R1 and R2, exemplary embodiments are not limited thereto. For example, the encapsulation substrate 400A of the display panel 10 may include the through holes 400AH corresponding to the first and second regions R1 and R2 while the substrate 100 may not include through holes. In another example, both the substrate 100 and the encapsulation substrate 400A of the display panel 10 may not include the through holes corresponding to the first and second regions R1 and R2. Even if the substrate 100 and the encapsulation substrate 400A do not include the through holes, the light transmittance of the first and second electronic elements 20 and 30 may be facilitated by removing portions of the insulating layer IL or elements disposed between the substrate 100 and the encapsulation substrate 400A and corresponding to the first and second regions R1 and R2.

Figure 2B:
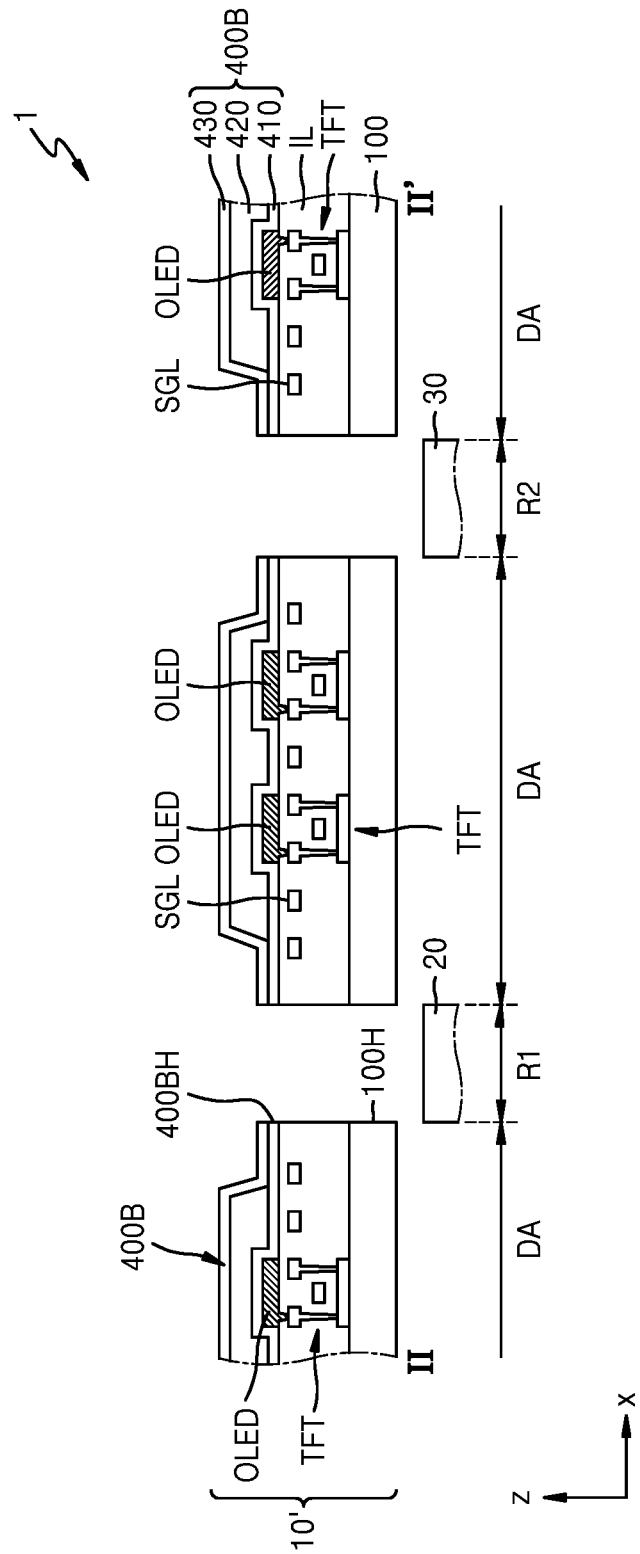
FIG. 2B is a cross-sectional view taken along line II-II' of FIG. 1 according to another exemplary embodiment.

FIG. 2B is a cross-sectional view taken along line II-II' of FIG. 1 according to another exemplary embodiment.

Referring to FIG. 2B, like the display device 1 described with reference to FIG. 2A, the display device 1 may include the display panel 10', and first and second electronic elements 20 and 30, the display panel 10' including a display element, and the first and second electronic elements 20 and 30 respectively corresponding to i.e., overlapping, the first region R1 and the second region R2 of the display panel 10'. The display device 1 may further include an input sensing member, a reflection prevention member, and a window each arranged on the display panel 10', the input sensing member sensing a touch input.

Unlike the display panel 10 described with reference to FIG. 2A which includes the encapsulation substrate 400A, which is an encapsulation member, and the sealing member 450, the display panel 10' of FIG. 2B may include a thin-film encapsulation layer 400B. In this case, the flexibility of the display panel 10' may be further improved. Hereinafter, for convenience of description, the differences between the encapsulation structures are mainly described.

The thin-film encapsulation layer 400B may include at least one inorganic layer and at least one organic layer. With regard to this, FIG. 2B shows first and second inorganic encapsulation layers 410 and 430 and an organic encapsulation layer 420 therebetween.

The first and second inorganic encapsulation layers 410 and 430 may include inorganic insulating materials selected from a group consisting of aluminum oxide, titanium oxide, tantalum oxide, hafnium oxide, zinc oxide, silicon oxide, silicon nitride, and silicon oxynitride. The organic encapsulation layer 420 may include a polymer-based material. The polymer-based material may include at least one of an acrylic-based resin, an epoxy-based resin, polyimide, and polyethylene.

The display panel 10' may include through holes corresponding to i.e., overlapping, the first and second regions R1 and R2. For example, the substrate 100 and the thin-film encapsulation layer 400B may respectively include through holes 100H and 400BH corresponding to the first and second regions R1 and R2. The first and second electronic elements 20 and 30 that use light or sound may be arranged in the first and second regions R1 and R2.

Unlike the display panel 10' which includes the through holes corresponding to the first and second regions R1 and R2, the display panel 10' of FIG. 2B may not include through holes. For example, the thin-film encapsulation layer 400B includes through holes 400BH corresponding to the first region R1 and the second region R2 while the substrate 100 may not include through holes. For another example, both the substrate 100 and the thin-film encapsulation layer 400B may not include through holes corresponding to the first region R1 and the second region R2. In this manner, light transmittance for the first and second electronic elements 20 and 30 may be facilitated by removing portions of the insulating layer IL or elements disposed between the substrate 100 and the thin-film encapsulation layer 400B and corresponding to the first and second regions R1 and R2.

Figure 3:
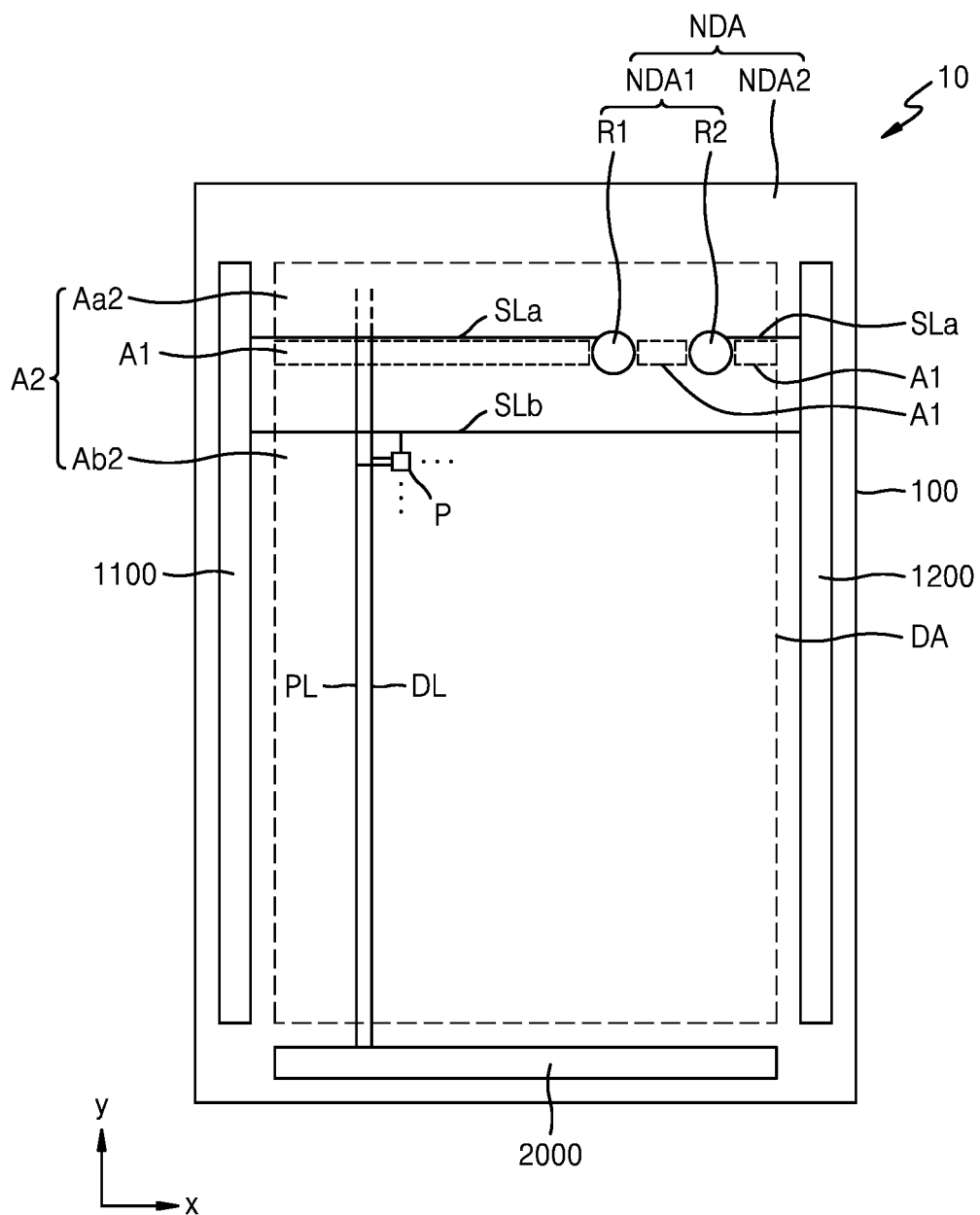
FIG. 3 is a plan view of an exemplary embodiment of a display panel constructed according to the principles of the invention.

FIG. 3 is a plan view of an exemplary embodiment of a display panel constructed according to the principles of the invention.

Referring to FIG. 3, the display panel 10 includes a plurality of sub-pixels P arranged in the display area DA. The sub-pixels P may be connected to scan lines SLa and scan lines SLb extending in a first direction (e.g. an x-direction or a (−) x-direction) and data lines DL and driving voltage lines PL extending in a second direction (e.g. a y-direction or a (−) y-direction) intersecting the first direction.

The sub-pixels P each may include a display element such as an organic light-emitting diode OLED. The sub-pixel P may emit, for example, red, green, blue, or white light through an organic light-emitting diode OLED. In the illustrated embodiments, it may be understood that a sub-pixel P is a pixel unit emitting red, green, blue, or white light. The display area DA may be covered by the encapsulation member described with reference to FIGS. 2A and 2B and thus protected by external air or moisture.

A first scan driver 1100 and a second scan driver 1200 may be arranged in the second non-display area NDA2, the first scan driver 1100 and the second scan driver 1200 providing scan signals to the sub-pixels P. The first scan driver 1100 may be arranged on the left of the display area DA, and the second scan driver 1200 may be arranged on the right of the display area DA.

The scan signals generated by the first scan driver 1100 may be provided to some of the sub-pixels P, and the scan signals generated by the second scan driver 1200 may be provided to the rest of the sub-pixels P.

The first and second scan drivers 1100 and 1200 may be arranged on two opposite sides of the display area DA and may perform dual scanning. For example, the first scan driver 1100 may generate and transfer the scan signals to some of the sub-pixels P in the display area DA, and the second scan driver 1200 may generate and transfer the scan signals to the rest of the sub-pixels P in the display area DA. The first and second scan drivers 1100 and 1200 may be synchronized by a synchronized clock signal.

In an exemplary embodiment, sub-pixels P arranged on the left of the first non-display area NDA1 may receive the scan signal generated by the first scan driver 1100, and sub-pixels P arranged on the right of the first non-display area NDA1 may receive the scan signal generated by the second scan driver 1200.

A data driver 2000, a main power line, etc. may be arranged in the second non-display area NDA2, the data driver 2000 providing a data signal to the sub-pixels P, and the main power line providing a driving voltage and/or a common voltage.

In the case where a plurality of sub-pixels P emits light, a brightness difference may occur due to a thickness difference of an opposite electrode described below even when a constant driving voltage or driving current is applied. Specifically, the display area DA includes at least one first area A1 and a second area A2, and a first area A1 is an area including an opposite electrode having a thickness different from a thickness of an opposite electrode in a second area A2. When a constant driving voltage or current is applied, a difference in brightness may occur between the first area A1 and the second area A2.

The first area A1 may be arranged inside the display area DA and may extend in the first direction. A plurality of first areas A1 may be apart from each other inside the display area DA. However, exemplary embodiments are not limited thereto and the first area A1 may extend in the second direction. Hereinafter, for convenience of description, the case where the first area A1 extends in the first direction is mainly described.

In an exemplary embodiment, the first area A1 may extend in the x-direction from the second non-display area NDA2 adjacent to the first scan driver 1100 to the first non-display area NDA1. Also, the first area A1 may extend in the (−) x-direction from the second non-display area NDA2 adjacent to the second scan driver 1200 to the first non-display area NDA1.

In an exemplary embodiment, the first area A1 may be arranged between the first region R1 and the second region R2. The first area A1 may extend in the first direction between the first region R1 and the second region R2. In another exemplary embodiment, the first area A1 may not be arranged between the first region R1 and the second region R2.

The second area A2 may denote a portion of the display area DA that excludes the first area A1. The second area A2 may neighbor the first non-display area NDA1, the second non-display area NDA2, and the first area A1. Particularly, the first area A1 may be arranged in the first direction across the second area A2. Therefore, the second area A2 may be divided into a (2-1)st area Aa2 and a (2-2)nd area Ab2 by the first area A1.

Figure 4:
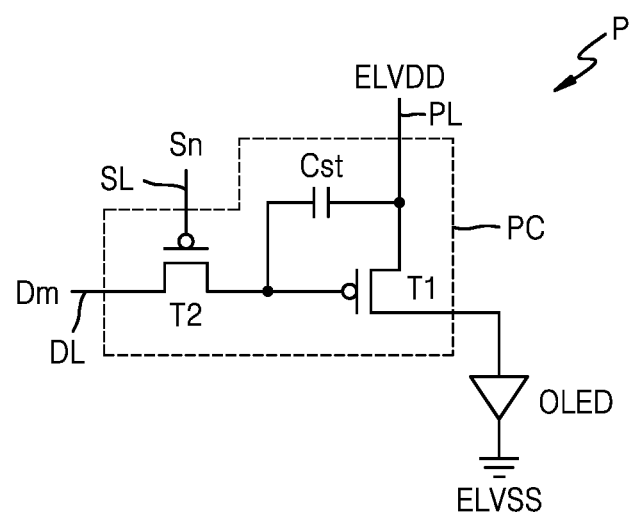
FIG. 4 is an equivalent circuit diagram of an exemplary embodiment of a representative sub-pixel of FIG. 3.

FIG. 4 is an equivalent circuit diagram of an exemplary embodiment of a representative sub-pixel of FIG. 3.

Referring to FIG. 4, each sub-pixel P includes a pixel circuit PC and an organic light-emitting diode OLED, the pixel circuit PC being connected to the scan line SL and the data line DL, and the organic light-emitting diode OLED being connected to the pixel circuit PC.

The pixel circuit PC may include a driving thin film transistor Tl, a switching thin film transistor T2, and a storage capacitor Cst. The switching thin film transistor T2 is connected to the scan line SL and the data line DL, and transfers a data signal Dm input through the data line DL to the driving thin film transistor T1 in response to a scan signal Sn input through the scan line SL.

The storage capacitor Cst is connected to the switching thin film transistor T2 and a driving voltage line PL, and stores a voltage corresponding to a difference between a voltage transferred through the switching thin film transistor T2 and a first power voltage ELVDD (or a driving voltage) supplied to the driving voltage line PL.

The driving thin film transistor T1 is connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a brightness by using the driving current.

While FIG. 4 shows that the pixel circuit PC includes two thin film transistors and one storage capacitor, exemplary embodiments are not limited thereto. The pixel circuit PC may include seven thin film transistors and one storage capacitor. Various modifications may be made.

Figure 5:
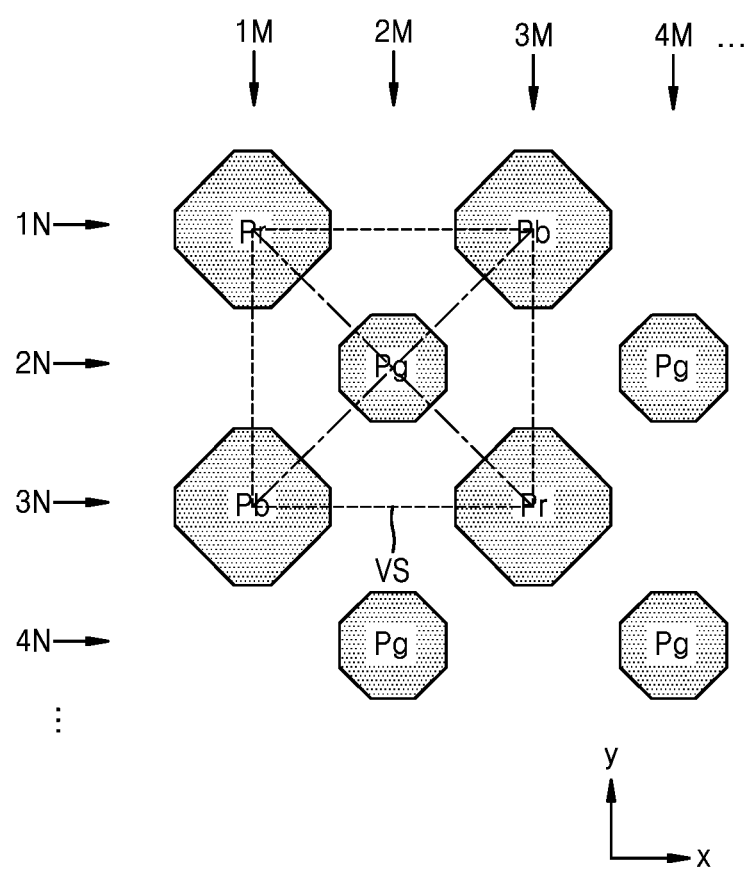
FIG. 5 is a plan view of an exemplary embodiment of arrangement of a plurality of sub-pixels of a display panel constructed according to the principles of the invention.

FIG. 5 is a plan view of an exemplary embodiment of arrangement of a plurality of sub-pixels of a display panel constructed according to the principles of the invention. In FIG. 5, a red sub-pixel Pr, a green sub-pixel Pg, and a blue sub-pixel Pb respectively denote sub-pixels emitting red light, green light, and blue light. The size of the sub-pixel may be defined by an opening of a pixel-defining layer, which will be described below.

A plurality of sub-pixels, for example, the red sub-pixel Pr, the green sub-pixel Pg, and the blue sub-pixel Pb may represent emission areas of a plurality of organic light-emitting diodes OLED. The emission areas of the plurality of organic light-emitting diodes OLED are similar to or substantially the same as the openings of the pixel-defining layer overlapping the plurality of organic light-emitting diodes OLED.

Referring to FIG. 5, the red sub-pixel Pr and the blue sub-pixel Pb may be alternately arranged in the first direction (e.g. an x-direction or a (−) x-direction) on a first row 1N, and the green sub-pixels Pg may be arranged spaced apart from each other in the first direction with a predetermined interval on a second row 2N neighboring the first row 1N. Likewise, the red sub-pixel Pr and the blue sub-pixel Pb may be alternately arranged on a third row 3N, and the green sub-pixels Pg may be arranged spaced apart from each other with a predetermined interval on a fourth row 4N neighboring the third row 3N. Such sub-pixel arrangement may be repeated up to a predetermined row set in advance.

The green sub-pixels Pg arranged on the second row 2N may be alternately arranged with the red sub-pixels Pr and the blue sub-pixels Pb on the first row 1N. Therefore, the red sub-pixel Pr and the blue sub-pixel Pb may be alternately arranged in the second direction (e.g. a y-direction or a (−) y-direction) on a first column 1M, and the green sub-pixels Pg may be arranged spaced apart from each other in the second direction with a predetermined interval on a second column 2M. Such sub-pixel arrangement may be repeated up to a predetermined column set in advance. In this case, the blue sub-pixel Pb and the red sub-pixel Pr may be larger than the green sub-pixel Pg. Alternatively, the blue sub-pixel Pb may be larger than the red sub-pixel Pr and the green sub-pixel Pg.

Such sub-pixel arrangement may be expressed in other words, in which: the green sub-pixel Pg is centered in a virtual quadrangle VS, the red sub-pixels Pr are arranged at first and third vertices of the virtual quadrangle VS that face each other, and the blue sub-pixels Pb are arranged at second and fourth vertices which are the rest of the vertices of the virtual quadrangle VS. Particularly, the red sub-pixels Pr and the blue sub-pixels Pb each are arranged in opposition around the central point of the virtual quadrangle VS. In this case, the virtual quadrangle VS may be a rectangle, a rhombus, a square, etc. Various modifications may be made.

The sub-pixel arrangement is not limited thereto. For example, in FIG. 5, instead of the green sub-pixel Pg, the blue sub-pixel Pb may be centered in the virtual quadrangle VS, the red sub-pixels Pr may be arranged at first and third vertices facing each other among vertices of the virtual quadrangle VS, and the green sub-pixels Pg may be arranged at second and fourth vertices which are the rest of the vertices of the virtual quadrangle VS.

Such sub-pixel arrangement structure is referred to as a pentile matrix structure which may implement a high resolution with a small number of sub-pixels by applying rendering driving which expresses color by sharing sub-pixels that neighbor each other.

Figure 6:
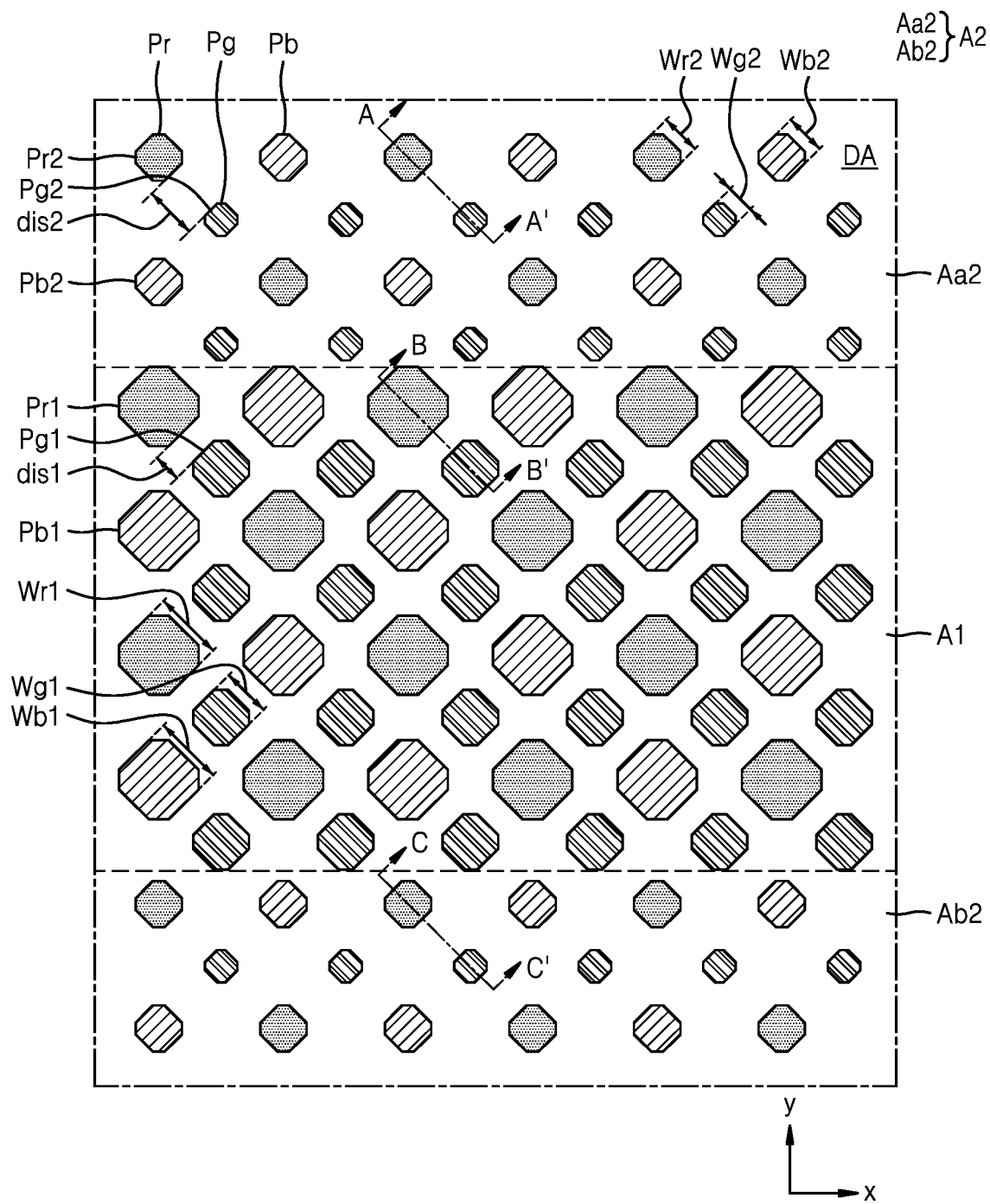
FIG. 6 is a plan view of an exemplary embodiment of arrangement of a plurality of sub-pixels in the first and second areas of FIG. 3.
Figure 7:
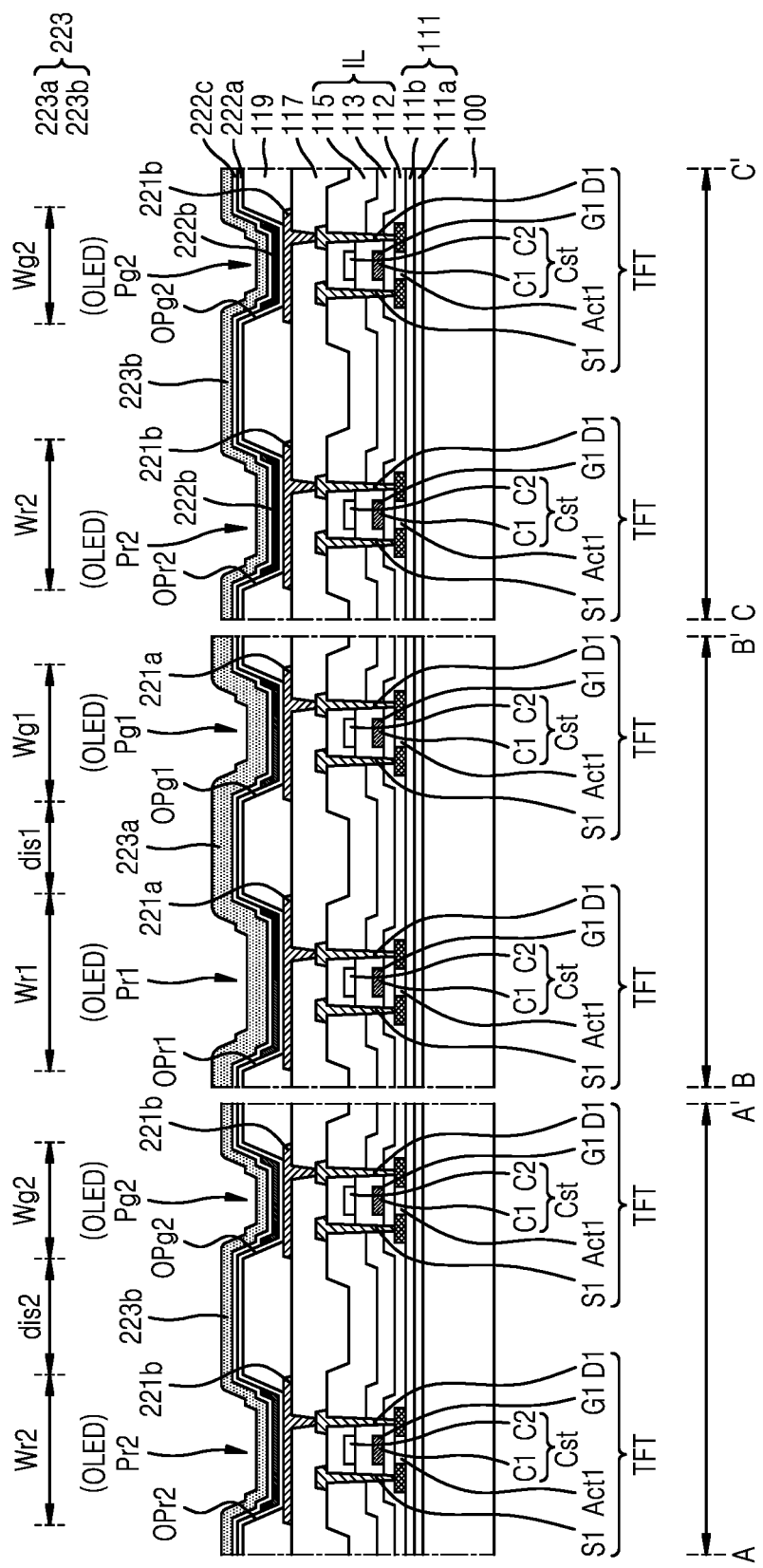
FIG. 7 is a cross-sectional view taken along lines A-A', B-B', and C-C' of FIG. 6.

FIG. 6 is a plan view of an exemplary embodiment of arrangement of a plurality of sub-pixels in the first and second areas of FIG. 3. FIG. 7 is a cross-sectional view taken along lines A-A', B-B', and C-C' of FIG. 6.

Referring to FIG. 6, a red sub-pixel Pr and a blue sub-pixel Pb may be alternately arranged in the first direction (e.g. the x-direction) in the display area DA, and green sub-pixels Pg may be arranged spaced apart from each other in the first direction with a predetermined interval. That is, the plurality of sub-pixels P may be arranged in a pentile matrix structure.

The first area A1 may be arranged in the first direction (e.g. the x-direction) across the second area A2. Particularly, the first area A1 may divide the second area A2 into a (2-1)st area Aa2 and a (2-2)nd area Ab2.

A plurality of sub-pixels P may be arranged in the first area A1 and the second area A2. Specifically, the first area A1 may include a first sub-pixel. The (2-1)st area Aa2 and the (2-2)nd area Ab2 included in the second area A2 may include a second sub-pixel. Particularly, the size of the first sub-pixel arranged in the first area A1 may be different from the size of a second sub-pixel arranged in the second area A2 and producing substantially the same color as that of the first sub-pixel. Here, the size of a sub-pixel may mean a planar area of an emission area implemented by a display element. For example, the size of a sub-pixel may mean a planar area of an opening defined by the pixel-defining layer described below. Hereinafter, for easy understanding of a planar area, the length thereof is expressed in the drawing.

For example, the size Wr1 of a first red sub-pixel Pr1 arranged in the first area A1 may be greater than the size Wr2 of a second red sub-pixel Pr2 arranged in the second area A2. For another example, the size Wg1 of a first green sub-pixel Pg1 arranged in the first area A1 may be greater than the size Wg2 of a second green sub-pixel Pg2 arranged in the second area A2. For another example, the size Wb1 of a first blue sub-pixel Pb1 arranged in the first area A1 may be greater than the size Wb2 of a second blue sub-pixel Pb2 arranged in the second area A2.

The shortest distance between first and second sub-pixels adjacent each other in the first area A1 may be different from the shortest distance between third and fourth sub-pixels adjacent each other in the second area A2 where the third and fourth sub-pixels produce substantially the same colors as the first and second sub-pixels, respectively. Here, the shortest distance may mean a planar distance between the openings of the pixel-defining layer. For example, a first shortest distance dis1 between the first red sub-pixel Pr1 and the first green sub-pixel Pg1 in the first area A1 may be different from a second shortest distance dis2 between the second red sub-pixel Pr2 and the second green sub-pixel Pg2 in the second area A2. Particularly, the first shortest distance dis1 may be less than the second shortest distance dis2.

Hereinafter, a stacked structure of the display device 1 is described with reference to FIG. 7. In FIG. 7, since the same reference numerals as those of FIG. 6 denote the same elements, repeated description thereof is omitted to avoid redundancy.

Referring to FIGS. 6 and 7, the substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including the polymer resin, and an inorganic layer.

A buffer layer 111 may be disposed on the substrate 100, may reduce or prevent the penetration of foreign substances, moisture, or external air from below the substrate 100, and may provide a flat surface on the substrate 100. The buffer layer 111 may include an inorganic material such as an oxide or a nitride, an organic material, or an organic/inorganic composite material and include a single-layered or multi-layered structure of an inorganic material and an organic material. A barrier layer may be further provided between the substrate 100 and the buffer layer 111, the barrier layer blocking the penetration of external air. In an exemplary embodiment, the buffer layer 111 may include $SiO_2$ or $SiN_x$. The buffer layer 111 may include a first buffer layer 111a and a second buffer layer 111b that are stacked.

A thin film transistor TFT may be arranged on the buffer layer 111. The thin film transistor TFT includes a semiconductor layer Act1, a gate electrode G1, a source electrode S1, and a drain electrode D1. The thin film transistor TFT may be connected to an organic light-emitting diode OLED in the display area DA to drive the organic light-emitting diode OLED.

The semiconductor layer Act1 may be arranged on the buffer layer 111 and may include polycrystalline silicon. In another exemplary embodiment, the semiconductor layer Act1 may include amorphous silicon. In another exemplary embodiment, the semiconductor layer Act1 may include an oxide of at least one of In, Ga, Sn, Zr, V, Hf, Cd, Ge, Cr, Ti, and Zn. The semiconductor layer Act1 may include a channel region, a source region, and a drain region, the source region and the drain region being doped with impurities.

A first gate insulating layer 112 may cover the semiconductor layer Act1. The first gate insulating layer 112 may include an inorganic insulating material including $SiO_2$, $SiN_x$, SiON, $Al_2O_3$, $TiO_2$, $Ta_2O_5$, $HfO_2$, and $ZnO_2$. The first gate insulating layer 112 may include a single layer or a multi-layer including the above inorganic insulating material.

The gate electrode G1 is arranged on the first gate insulating layer 112 so as to overlap the semiconductor layer Act1. The gate electrode G1 may include a single layer or a multi-layer including at least one of Mo, Al, Cu, and Ti. For example, the gate electrode G1 may be a single Mo layer.

A second gate insulating layer 113 may cover the gate electrode G1. The second gate insulating layer 113 may include at least one inorganic insulating material among $SiO_2$, $SiN_x$, SiON, $Al_2O_3$, $TiO_2$, $Ta_2O_5$, $HfO_2$, and $ZnO_2$.

The second gate insulating layer 113 may include a single layer or a multi-layer including the above inorganic insulating material.

A top electrode C2 of a main storage capacitor Cst may be arranged on the second gate insulating layer 113.

The top electrode C2 may overlap the gate electrode G1 therebelow. The gate electrode G1 and the top electrode C2 may constitute the main storage capacitor Cst, the gate electrode G1 and the top electrode C2 overlapping each other with the second gate insulating layer 113 therebetween. That is, the gate electrode G1 may serve as a bottom electrode C1 of the main storage capacitor Cst.

The top electrode C2 may include a single layer or a multi-layer including at least one of Al, Pt, Pd, Ag, Mg, Au, Ni, Nd, Ir, CR, Li, Ca, Mo, Ti, W, and Cu.

An interlayer insulating layer 115 may cover the top electrode C2. The interlayer insulating layer 115 may include at least one of $SiO_2$, $SiN_x$, SiON, $Al_2O_3$, $TiO_2$, $Ta_2O_5$, $HfO_2$, and $ZnO_2$.

The source electrode S1 and the drain electrode D1 may be arranged on the interlayer insulating layer 115. The source electrode S1 and the drain electrode D1 may include a conductive material including Mo, Al, Cu, and Ti and include a single layer or a multi-layer including the above materials. For example, the source electrode S1 and the drain electrode D1 may have a multi-layered structure of Ti/Al/Ti.

A planarization layer 117 may cover the source electrode S1 and the drain electrode D1. The planarization layer 117 may have a flat top surface such that a first pixel electrode 221a and a second pixel electrode 221b arranged thereon are formed flat.

The planarization layer 117 may include a single layer or a multi-layer including an organic material or an inorganic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The planarization layer 117 may include $SiO_2$, $SiN_x$, SiON, $Al_2O_3$, $TiO_2$, $Ta_2O_5$, $HfO_2$, or $ZnO_2$. After the planarization layer 117 is formed, chemical mechanical polishing may be performed so as to provide a flat top surface.

The planarization layer 117 includes an opening exposing one of the source electrode S1 and the drain electrode D1 of the thin film transistor TFT. The first pixel electrode 221a or the second pixel electrode 221b may be electrically connected to the thin film transistor TFT by contacting the source electrode S1 or the drain electrode D1 through the opening. Particularly, the first pixel electrode 221a may be arranged in the first area A1, and the second pixel electrode 221b may be arranged in the second area A2.

The first pixel electrode 221a and the second pixel electrode 221b may include a conductive oxide including indium tin oxide (ITO), zinc oxide (IZO), zinc oxide (ZnO), indium oxide ($In_2O_3$), indium gallium oxide (IGO), and aluminum zinc oxide (AZO). In another exemplary embodiment, the first pixel electrode 221a and the second pixel electrode 221b may include a reflective layer including Ag, Mg, Al, Pt, Pd, Au, Ni, Nd, Ir, Cr, or a compound thereof. In another exemplary embodiment, the first pixel electrode 221a and the second pixel electrode 221b may further include a layer including ITO, IZO, ZnO, or $In_2O_3$ on/under the reflective layer. In an exemplary embodiment, the first pixel electrode 221a and the second pixel electrode 221b may have a stacked structure of ITO/Ag/ITO.

A pixel-defining layer 119 may be disposed on the planarization layer 117 and cover edges of each of the first pixel electrode 221a and the second pixel electrode 221b. The pixel-defining layer 119 includes openings respectively overlapping the first pixel electrode 221a and the second pixel electrode 221b to define sizes of corresponding sub-pixels. The pixel-defining layer 119 may prevent an arc, etc. from occurring at edges of the pixel electrodes, for example, the first and second pixel electrode 221a and 221b by increasing a distance between the edges of the first and second pixel electrode 221a and 221b, and an opposite electrode over the first and second pixel electrodes 221a and 221b. The pixel-defining layer 119 may include an organic insulating material such as polyimide, polyamide, an acrylic resin, BCB, HMDSO, and a phenolic resin. The pixel-defining layer 119 may be formed by a method such as spin coating.

The openings of the pixel-defining layer 119 may include a red sub-pixel opening which overlaps the organic light-emitting diode OLED emitting red light, a green sub-pixel opening which overlaps the organic light-emitting diode OLED emitting green light, and a blue sub-pixel opening which overlaps the organic light-emitting diode OLED emitting blue light. Referring to FIG. 7, the pixel-defining layer 119 may include a first red sub-pixel opening OPr1 and a first green sub-pixel opening OPg1 arranged on the first pixel electrodes 221a. Also, the pixel-defining layer 119 may include a second red sub-pixel opening OPr2 and a second green sub-pixel opening OPg2 arranged on the second pixel electrodes 221b.

The size of the red sub-pixel opening inside the first area A1 may be greater than the size of the red sub-pixel opening inside the second area A2. For example, the size of the first red sub-pixel opening OPr1 may be greater than the size of the second red sub-pixel opening OPr2. Also, the size of the green sub-pixel opening inside the first area A1 may be greater than the size of the green sub-pixel opening inside the second area A2. For example, the size of the first green sub-pixel opening OPg1 may be greater than the size of the second green sub-pixel opening OPg2.

The size of the red sub-pixel opening may be greater than the size of the green sub-pixel opening in the same area. For example, the size of the first red sub-pixel opening OPr1 may be greater than the size of the first green sub-pixel opening OPg1. For another example, the size of the second red sub-pixel opening OPr2 may be greater than the size of the second green sub-pixel opening OPg2.

A first functional layer 222a may be arranged on the first and second pixel electrodes 221a and 221b exposed by the openings of the pixel-defining layer 119. The first functional layer 222a may extend to a top surface of the pixel-defining layer 119. The first functional layer 222a may include a single layer or a multi-layer. The first functional layer 222a may include a hole transport layer (HTL) which has a single-layered structure. Alternatively, the first functional layer 222a may include a hole injection layer (HIL) and an HTL. The first functional layer 222a may be provided as one body so as to correspond to the sub-pixels P in the display area DA.

An emission layer 222b is arranged on the first functional layer 222a so as to correspond to each of the first and second pixel electrodes 221a and 221b. The emission layer 222b may include a polymer material or a low molecular weight material, and emit red, green, blue, or white light.

A second functional layer 222c may be disposed on the emission layer 222b. The second functional layer 222c may include a single layer or a multi-layer. The second functional layer 222c may include an electron transport layer (ETL) and/or an electron injection layer (EIL). The second functional layer 222c may be provided as one body so as to correspond to the sub-pixels P in the display area DA. The first functional layer 222a and/or the second functional layer 222c may be omitted.

An opposite electrode 223 is disposed over the second functional layer 222c. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or 111203 on/under the (semi) transparent layer including the above material.

One of the first and second pixel electrodes 221a and 221b, the emission layer 222b, and a portion of the opposite electrode 223 overlapping the emission layer 222b may form the organic light-emitting diode OLED. The organic light-emitting diode OLED may further include a portion of the first functional layer 222a and a portion of the second functional layer 222c overlapping the emission layer 222b. The organic light-emitting diode OLED may emit light through an emission area which is a portion of the emission layer 222b exposed by the opening of the pixel-defining layer 119. The emission area may determine the size of a corresponding sub-pixel.

The opposite electrode 223 may have different thicknesses in the first and second areas A1 and A2. The opposite electrode 223 may include a first opposite electrode 223a and a second opposite electrode 223b. The first opposite electrode 223a may correspond to i.e., overlap a first sub-pixel disposed in the first area A1, and the second opposite electrode 223b may correspond to i.e., overlap a second sub-pixel disposed in the second area A2 and producing substantially the same color as that of the first sub-pixel. For example, the first opposite electrode 223a may correspond to the first red sub-pixel Pr1, and the second opposite electrode 223b may correspond to the second red sub-pixel Pr2. For another example, the first opposite electrode 223a may correspond to the first green sub-pixel Pg1, and the second opposite electrode 223b may correspond to the second green sub-pixel Pg2.

Since the first area A1 includes the first red sub-pixel Pr1 and the first green sub-pixel Pg1 (see FIG. 6), the first opposite electrode 223a may correspond to i.e., overlap the first area A1. Since the second area A2 includes the second red sub-pixel Pr2 and the second green sub-pixel Pg2, the second opposite electrode 223b may correspond to i.e., overlap the second area A2. Therefore, the first opposite electrode 223a may extend in the first direction along the first area A1. Since the first area A1 may be arranged in the first direction across the second area A2, the first opposite electrode 223a may be arranged across the second opposite electrode 223b.

The first opposite electrode 223a may be electrically connected to the second opposite electrode 223b. In an exemplary embodiment, the first opposite electrode 223a and the second opposite electrode 223b may be provided as one body.

The thickness of the first opposite electrode 223a may be different from the thickness of the second opposite electrode 223b. Particularly, the thickness of the first opposite electrode 223a may be greater than the thickness of the second opposite electrode 223b.

A capping layer may be provided on the opposite electrode 223, the capping layer protecting the opposite electrode 223 and improving light extraction efficiency. The capping layer may include LiF. Alternatively, the capping layer may include an inorganic insulating material such as silicon nitride, and/or include an organic insulating material. In an exemplary embodiment, the capping layer may be omitted.

Since the thickness of the first opposite electrode 223a is different from the thickness of the second opposite electrode 223b, brightness of light emitted from the first sub-pixel in the first area A1 may be different from brightness of light emitted from the second sub-pixel in the second area A2. For example, due to some of the manufacturing processes of the display panel 10 that include the first and second regions R1 and R2 of FIG. 3, the opposite electrode 223 may have different thicknesses in the first and second areas A1 and A2. In this manner, the brightness difference in light may be reduced by making the first sub-pixel greater than the second sub-pixel. Consequently, the brightness deviation of the overall light is reduced and an optical compensation process may be improved.

In another exemplary embodiment, the brightness difference between the first area A1 and the second area A2 may be reduced by increasing the driving voltage or current applied to the first area A1 compared to the second area A2. When the driving voltage or current is increased, a layer including an organic material inside the organic light-emitting diode OLED may deteriorate, and thus the lifetime of the organic light-emitting diode OLED may be reduced. Such deterioration of the organic light-emitting diodes OLED may be reduced and the lifetime may be improved by increasing sizes of sub-pixels inside the first area A1 in which the driving voltage or current is increased.

Hereinafter, a manufacturing method in which the thickness of the first opposite electrode 223a may be different from the thickness of the second opposite electrode 223b is described in detail.

Figure 8A:
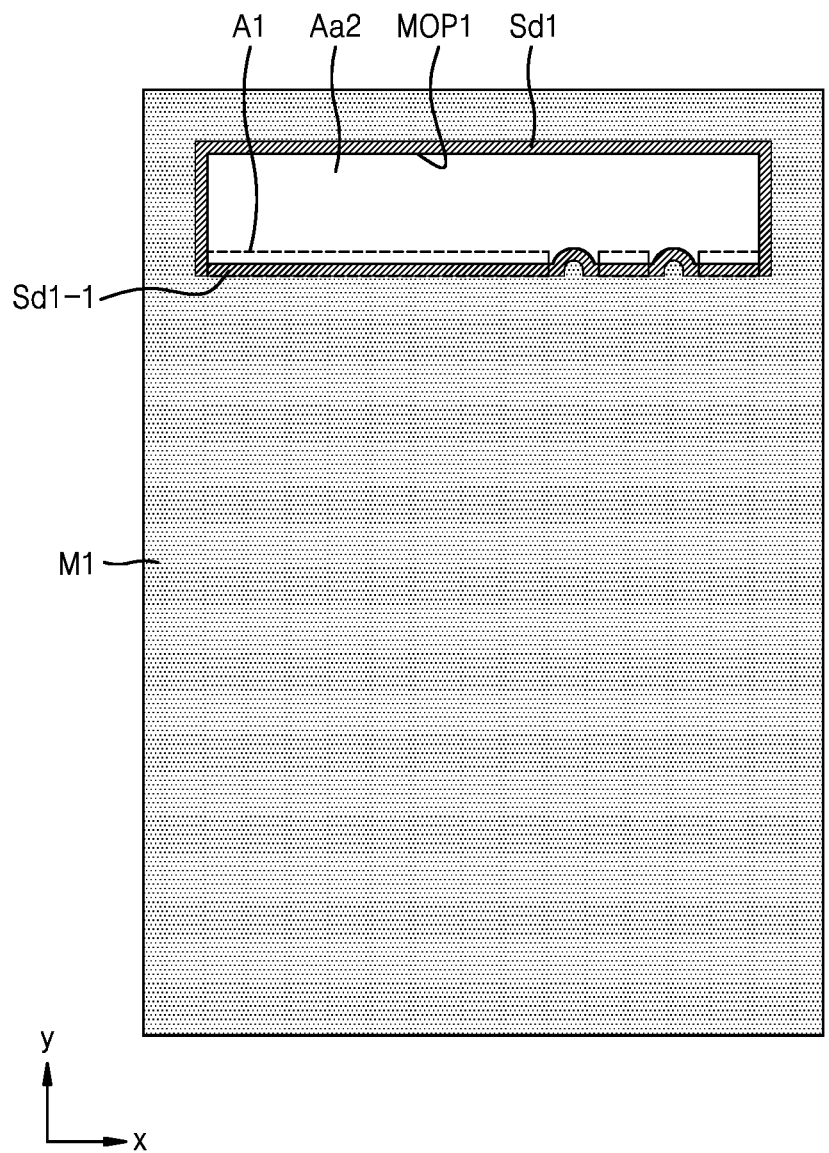
FIGS. 8A and 8B are plan views of exemplary embodiments of masks for forming an opposite electrode in a display area in some exemplary manufacturing processes according to the principles of the invention.
Figure 8B:
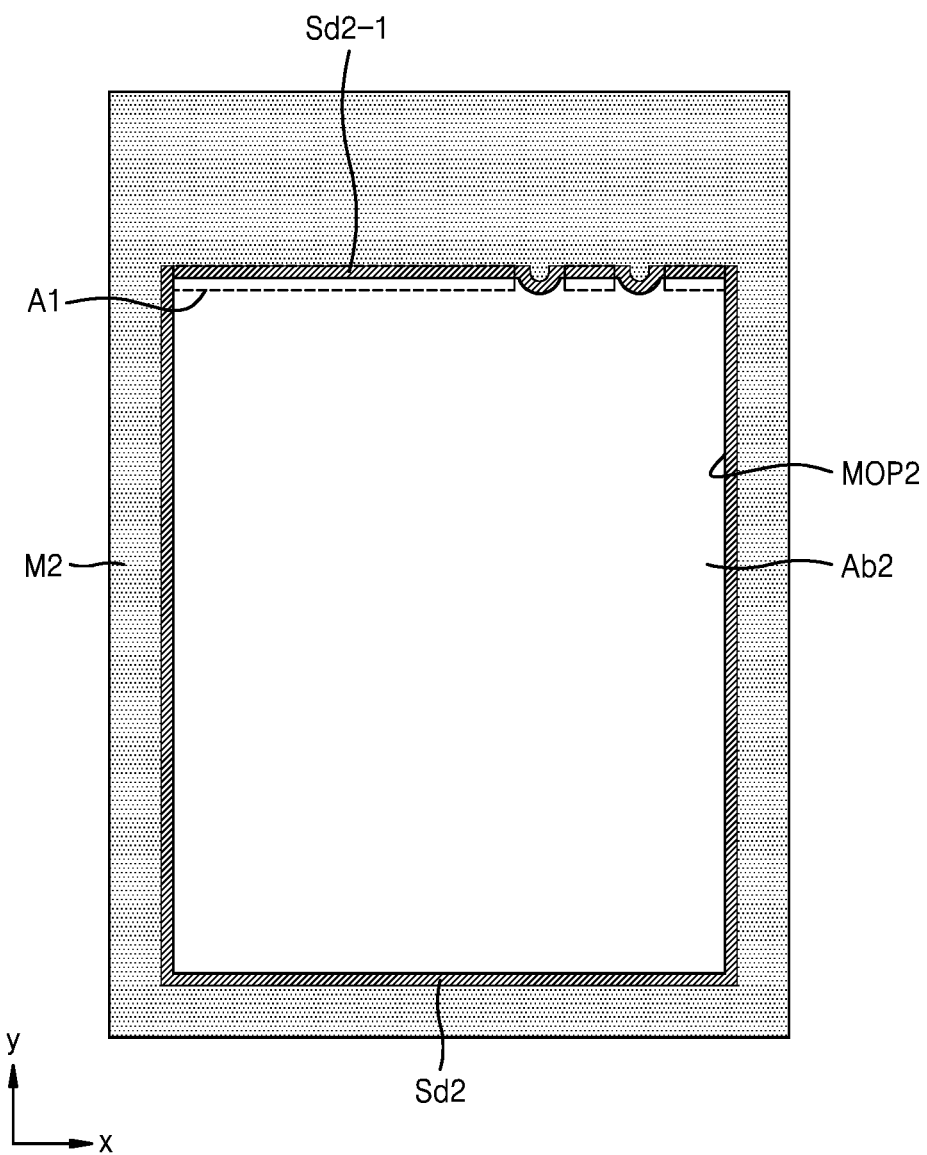

FIGS. 8A and 8B are plan views of exemplary embodiments of masks for forming an opposite electrode in a display area in some exemplary manufacturing processes according to the principles of the invention.

Referring to FIG. 8A, the first mask M1 may include a first opening MOP1. The first opening MOP1 may be formed to correspond to the shape of the (2-1)st area Aa2 of FIG. 3.

Referring to FIG. 8B, the second mask M2 may include a second opening MOP2. The second opening MOP2 may be formed to correspond to the shape of the (2-2)nd area Ab2 of FIG. 3.

The first mask M1 and the second mask M2 are masks used for forming the opposite electrode 223 of FIG. 7 and may be fine metal masks (FMM). An FMM may be manufactured by forming a hole in a metal plate and then applying tension.

The first opening MOP1 and the second opening MOP2 may be used for forming the opposite electrode 223.

In an exemplary embodiment, the electrode material for the opposite electrode 223 may be deposited by using the first mask M1 and the second mask M2. The first mask M1 of FIG. 8A may be used for depositing the electrode material in the first area A1 and the (2-1)st area Aa2 of FIG. 3. The second mask M2 of FIG. 8B may be used for depositing the electrode material in the first area A1 and the (2-2)nd area Ab2 of FIG. 3.

Referring to FIG. 8A, after the second functional layer 222c (see FIG. 7) is formed over the substrate 100, the first opening MOP1 is arranged to correspond to the (2-1)st area Aa2.

Next, the electrode material is deposited on the second functional layer 222c through the first opening MOP1 to be formed as a portion of the opposite electrode 223 using a deposition source.

The portion of the opposite electrode 223 may also be formed outside the first opening MOP1 of the first mask M1. This phenomenon is referred to as a shadow phenomenon. For example, the portion of the opposite electrode 223 may be formed in a first shadow area Sd1 outside the first opening MOP1. A first shadow portion Sd1-1 of the first shadow area Sd1 may be disposed in the first area A1.

Next, as shown in FIG. 8B, the second mask M2 is arranged such that the second opening MOP2 may correspond to the (2-2)nd area Ab2, and then the electrode material is secondarily deposited. In this case, a portion of the opposite electrode 223 may be formed according to the second opening MOP2 of the second mask M2. Due to the shadow phenomenon, the portion of the opposite electrode 223 may also be formed in a second shadow area Sd2 outside the second opening MOP2. For example, a second shadow portion Sd2-1 of the second shadow area Sd2 may be disposed in the first area A1.

While an area in which the electrode material is deposited through the first opening MOP1 is different from an area in which the electrode material is deposited through the second opening MOP2, the electrode material deposited through the first opening MOP1 may overlap the electrode material deposited through the second opening MOP2. Particularly, a portion of the opposite electrode 223 formed in the first shadow portion Sd1-1 and the second shadow portion Sd2-1 may constitute the first opposite electrode 223a of FIG. 7.

The electrode material is primarily deposited in the (2-1)st area Aa2 that does not overlap the first shadow portion Sd1-1, and the electrode material is secondarily deposited in the (2-2)nd area Ab2 that does not overlap the second shadow area Sd2-1 to form the second opposite electrode 223b of FIG. 7. Therefore, the thickness of the first opposite electrode 223a may be different from the thickness of the second opposite electrode 223b. Particularly, the thickness of the first opposite electrode 223a may be greater than the thickness of the second opposite electrode 223b. However, the method of manufacturing the display device is not limited to the above-described manufacturing method and the display device may be manufactured by various methods.

Figure 9:
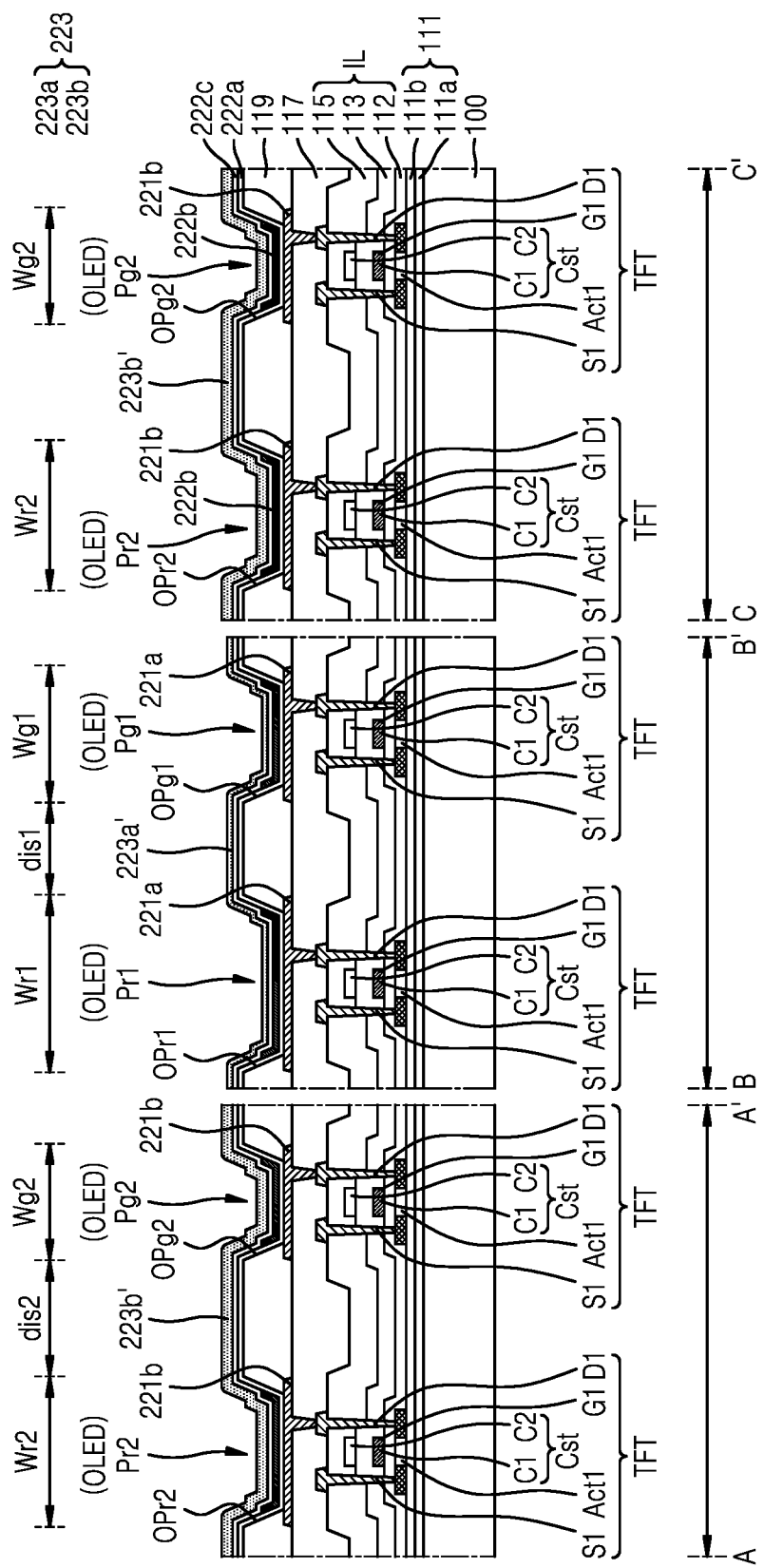
FIG. 9 is a cross-sectional view taken along lines A-A', B-B', and C-C' of FIG. 6 according to another exemplary embodiment.
Figure 10:
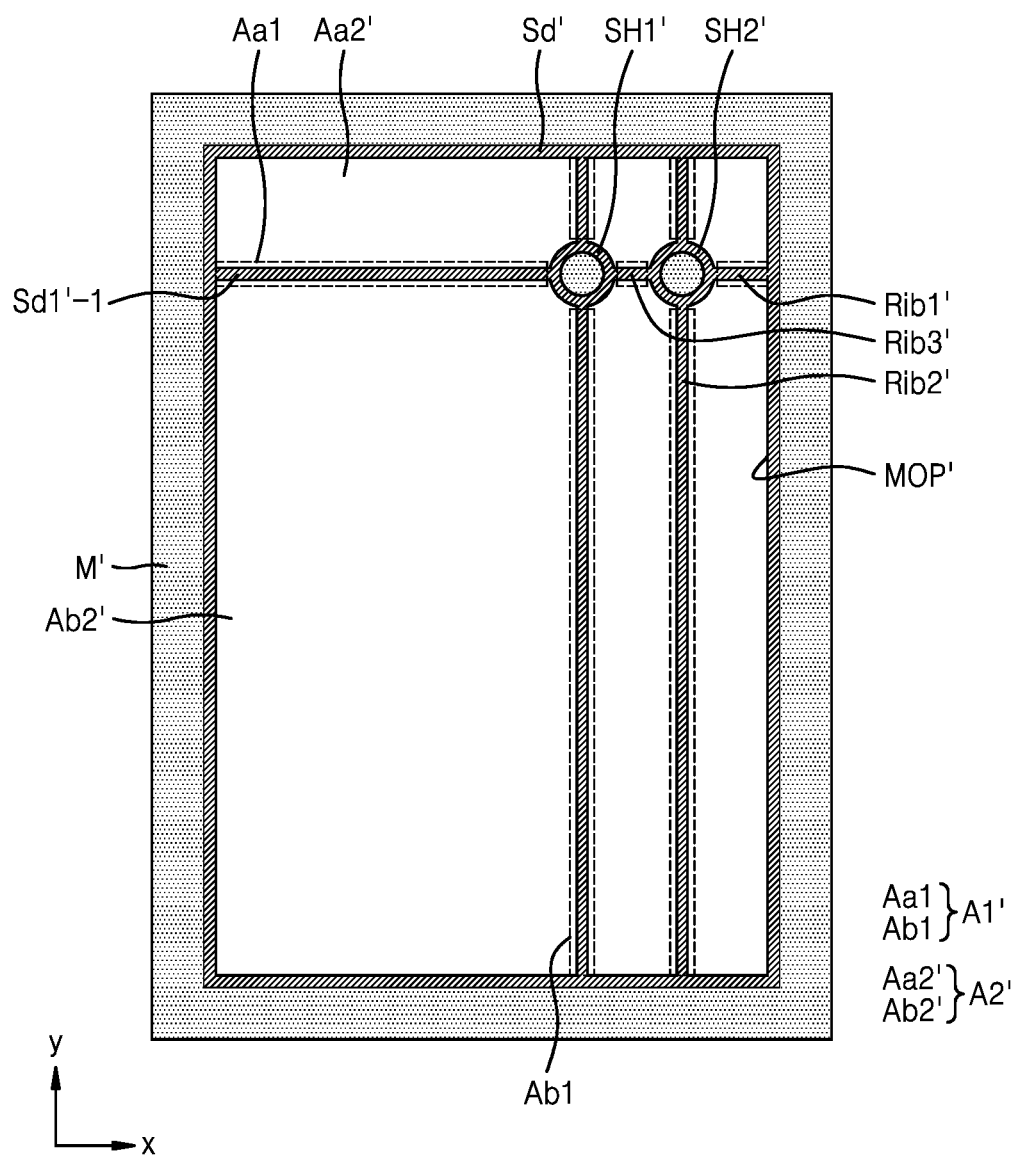
FIG. 10 is a plan view of an exemplary embodiment of a mask for forming an opposite electrode in a display area in a manufacturing process according to the principles of the invention.

FIG. 9 is a cross-sectional view taken along lines A-A', B-B', and C-C' of FIG. 6 according to another exemplary embodiment. FIG. 10 is a plan view of an exemplary embodiment of a mask for forming an opposite electrode in a display area in a manufacturing process according to the principles of the invention.

In FIG. 9, since the same reference numerals as those of FIG. 7 denote the same elements, repeated description thereof is omitted to avoid redundancy.

The first opposite electrode 223a' and second opposite electrode 223b' of FIG. 9 are similar to the first opposite electrode 223a and the second opposite electrode 223b of FIG. 6 except that the thickness of the first opposite electrode 223a' may be less than the thickness of the second opposite electrode 223b'.

Referring to FIG. 10, the display area DA may include a first area A1' and a second area A2'. The first area A1' may extend in the first direction (e.g. an x-direction or a (−) x-direction) and the second direction (e.g. a y-direction or a (−) y-direction) intersecting the first direction. The first area A1' may include at least one (1-1)st area Aa1 extending in the first direction and at least one (1-2)nd area Ab1 extending in the second direction. Particularly, the first direction may be perpendicular to the second direction. The second area A2' may be the remaining area of the display area DA. For example, the second area A2' may include a (2-1)st area Aa2' and a (2-2)nd area Ab2' divided by the (1-1)st area Aa1 of the first area A1'. Therefore, the first area A1' may be arranged in the first direction and the second direction across the second area A2' in the display area DA. For example, the first area A1' may extend in the x-direction and the y-direction.

Hereinafter, a manufacturing method in which the thickness of the first opposite electrode 223a is less than the thickness of the second opposite electrode 223b is described.

A mask M' of FIG. 10 may be used for forming an opposite electrode in the display area DA.

The mask M' includes an opening MOP'. The mask M' includes a first shielding portion SH1' and a second shielding portion SH2' each having a circular shape. The number of shielding portions is not limited to two and one shielding portion or three or more shielding portions may be provided. However, for convenience of description, the case where the first shielding portion SH1' and the second shielding portion SH2' are provided is mainly described.

The first shielding portion SH1' or the second shielding portion SH2' may have a circular shape. However, the first shielding portion SH1' and the second shielding portion SH2' are not limited thereto and may have a polygonal shape including a triangular shape and a quadrangular shape.

The first shielding portion SH1' and the second shielding portion SH2' may be intended for preventing electrode material from being deposited in the first region R1 and the second region R2 of FIG. 3. Therefore, shapes of the first shielding portion SH1' and the second shielding portion SH2' may be similar to shapes of the first region R1 and the second region R2.

The first shielding portion SH1' or the second shielding portion SH2' may have at least one rib so as to be supported by the mask M' in the opening MOP'. For example, the first shielding portion SH1' or the second shielding portion SH2' may include a first rib Rib1' in the first direction (e.g. the x-direction or the (−) x-direction) so as to be supported by the mask M'. As another example, the first shielding portion SH1' or the second shielding portion SH2' may include a second rib Rib2' in the second direction (e.g. the y-direction or the (−) y-direction) so as to be supported by the mask M'. Also, the first shielding portion SH1' and the second shielding portion SH2' may include a third rib Rib3' to support each other.

The first rib Rib1', the second rib Rib2', and the third rib Rib3' may be arranged across the opening MOP'. Therefore, the first rib Rib1', the second rib Rib2', and the third rib Rib3' may divide the opening MOP'.

The mask M' may be a mask used for depositing electrode material and may be a fine metal mask (FMM). An FMM may be manufactured by forming a hole in a metal plate and then applying tension.

The opening MOP' may be intended for forming the opposite electrode. Referring to FIG. 10, after the second functional layer 222c (see FIG. 9) is formed over the substrate 100, the opening MOP' may be arranged to correspond to the second area A2'.

Next, the electrode material is deposited on the second functional layer 222c through the opening MOP' to be formed as the opposite electrode using a deposition source. In this case, a portion of the opposite electrode is formed in a region overlapping the opening MOP' of the mask M'.

The opposite electrode may be also formed in a shadow area Sd' adjacent to the opening MOP'. For example, the opposite electrode may be formed outside the opening MOP' of the mask M' and in regions overlapping the first rib Rib1', the second rib Rib2', the third rib Rib3', the first shielding portion SH1', and the second shielding portion SH2'. A portion of the shadow area Sd' may be included in the first area A1'.

Since the portion of opposite electrode in the shadow area Sd' is formed by a shadow phenomenon, the amount of the electrode material deposited in the shadow area Sd' may be less than the amount of the electrode material deposited in the second area A2'. Therefore, the thickness of the first opposite electrode 223a' formed in the first area A1' may be less than the thickness of the second opposite electrode 223b' formed in the second area A2'. However, the method of manufacturing the display device is not limited to the above-described manufacturing method and the display device may be manufactured by using various methods.

In case where the thickness of the first opposite electrode 223a' is less than the thickness of the second opposite electrode 223b', due to a resistance of a metal of the opposite electrode, the brightness of light emitted from the first sub-pixel in the first area A1' may be less than the brightness of light emitted from the second sub-pixel in the second area A2'. In this manner, the brightness of light of the first sub-pixel may increase by making the size of the first sub-pixel greater than the size of the second sub-pixel. Consequently, the brightness deviation of the overall light is reduced and an optical compensation process may be improved.

In another exemplary embodiment, the brightness difference of light between the first area A1' and the second area A2' may be reduced by increasing a driving voltage or current applied to the first area A1' compared to the second area A2'. When the driving voltage or current is increased, a layer including an organic material inside the organic light-emitting diode OLED may be deteriorated, and thus the lifetime of the organic light-emitting diode OLED may be reduced. Such deterioration of the organic light-emitting diodes OLED may be reduced and the lifetime may be improved by increasing sizes of sub-pixels inside the first area A1' in which the driving voltage or current is increased.

Figure 11:
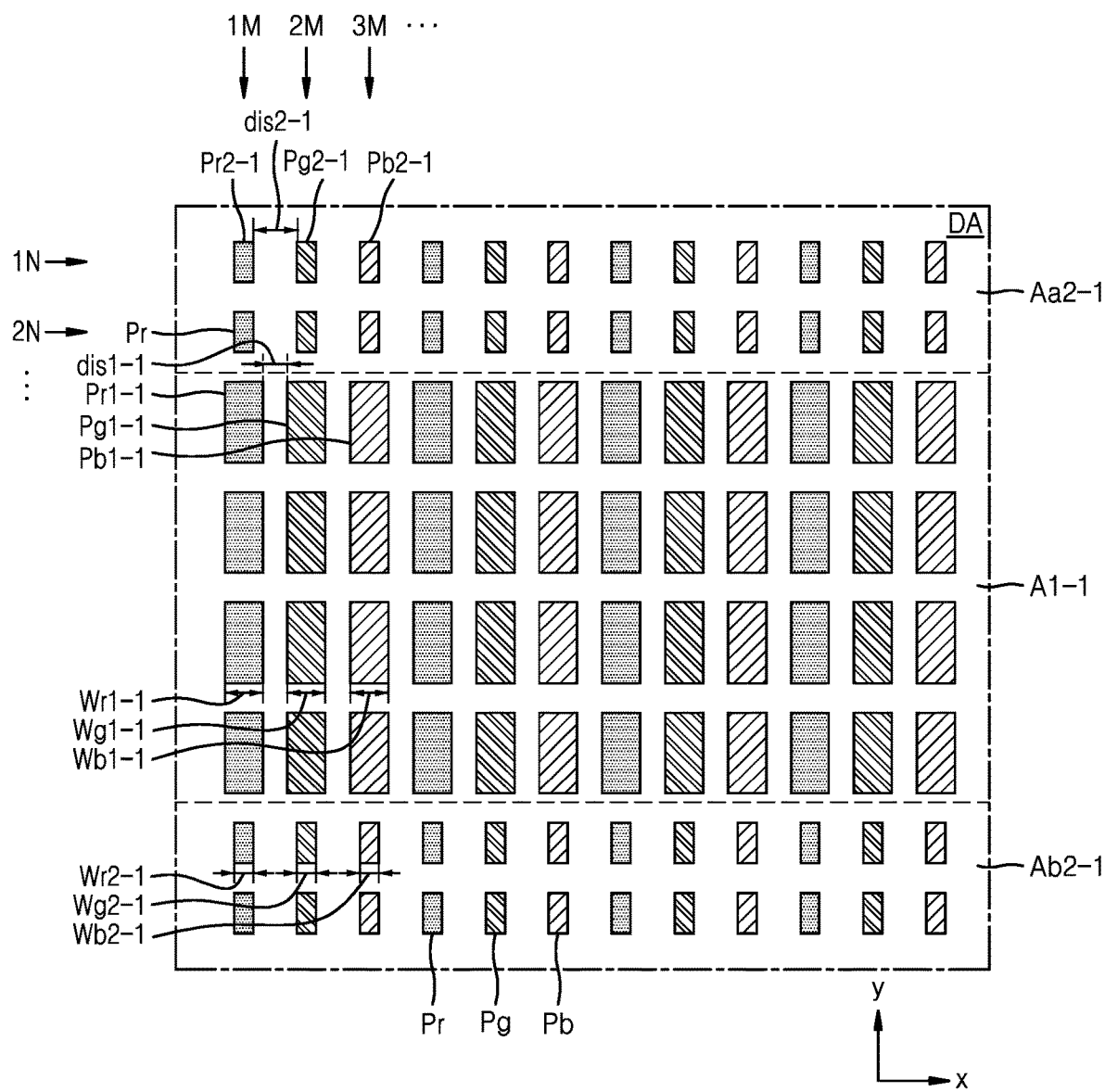
FIG. 11 is a plan view of another exemplary embodiment of arrangement of a plurality of sub-pixels in the first and second areas of FIG. 3.

FIG. 11 is a plan view of another exemplary embodiment of arrangement of a plurality of sub-pixels in the first and second areas of FIG. 3.

Referring to FIG. 11, a red sub-pixel Pr, a green sub-pixel Pg, and a blue sub-pixel Pb may be alternately arranged in the first direction (e.g. the x-direction or the (−) x-direction) on a first row 1N. The red sub-pixel Pr, the green sub-pixel Pg, and the blue sub-pixel Pb may be alternately arranged in the first direction (e.g. the x-direction or the (−) x-direction) on also a second row 2N. Such sub-pixel arrangement may be repeated up to a predetermined row set in advance.

The red sub-pixels Pr may be successively arranged in the second direction (the y-direction or the (−) y-direction) on a first column 1M, the green sub-pixels Pg may be successively arranged in the second direction (the y-direction or the (−) y-direction) on a second column 2M adjacent to the first column 1M, and the blue sub-pixels Pb may be successively arranged in the second direction on a third column 3M adjacent to the second column 2M. Such sub-pixel arrangement may be repeated up to a predetermined column set in advance.

In this case, sizes of the red sub-pixels Pr, the green sub-pixels Pg, and the blue sub-pixels Pb may be substantially the same. Such sub-pixel arrangement is referred to as an RGB vertical stripe structure.

Since a first area A1-1, a (2-1)st area Aa2-1, a (2-2)nd area Ab2-1, a first red sub-pixel PH-1, a first green sub-pixel Pg1-1, a first blue sub-pixel Pb1-1, a second red sub-pixel Pr2-1, a second green sub-pixel Pg2-1, a second blue sub-pixel Pb2-1, the size Wr1-1 of the first red sub-pixel PH-1, the size Wr2-1 of the second red sub-pixel Pr2-1, the size Wg1-1 of the first green sub-pixel Pg1-1, the size Wg2-1 of the second green sub-pixel Pg2-1, the size Wb1-1 of the first blue sub-pixel Pb1-1, the size Wb2-1 of the second blue sub-pixel Pb2-1, a first shortest distance dis1-1, and a second shortest distance dis2-1 of FIG. 11 are described similar to the first area A1, the (2-1)st area Aa2, the (2-2)nd area Ab2, the first red sub-pixel Pr1, the first green sub-pixel Pg1, the first blue sub-pixel Pb1, the second red sub-pixel Pr2, the second green sub-pixel Pg2, the second blue sub-pixel Pb2, the size Wr1 of the first red sub-pixel Pr1, the size Wr2 of the second red sub-pixel Pr2, the size Wg1 of the first green sub-pixel Pg1, the size Wg2 of the second green sub-pixel Pg2, the size Wb1 of the first blue sub-pixel Pb1, the size Wb2 of the second blue sub-pixel Pb2, the first shortest distance dis1, and the second shortest distance dis2 of FIG. 6, detailed description thereof is omitted to avoid redundancy.

Figure 12:
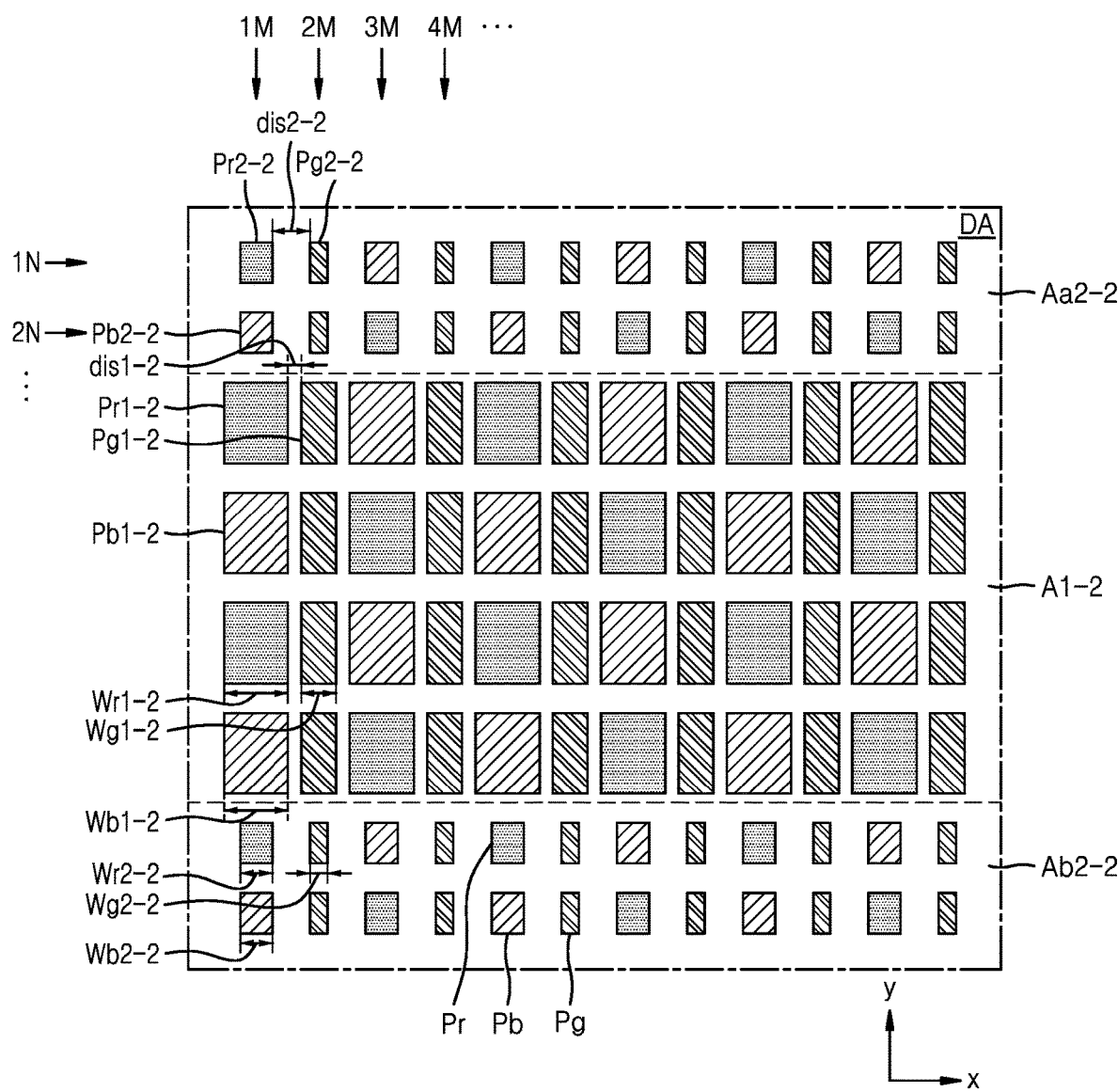
FIG. 12 is a plan view of still another exemplary embodiment of arrangement of a plurality of sub-pixels in the first and second areas of FIG. 3.

FIG. 12 is a plan view of still another exemplary embodiment of arrangement of a plurality of sub-pixels in the first and second areas of FIG. 3.

Referring to FIG. 12, a red sub-pixel Pr, a green sub-pixel Pg, a blue sub-pixel Pb, and a green sub-pixel Pg may be alternately arranged in the first direction (e.g. the x-direction or the (−) x-direction) on a first row 1N. The blue sub-pixel Pb, the green sub-pixel Pg, the red sub-pixel Pr, and the green sub-pixel Pg may be alternately arranged on a second row 2N adjacent to the first row 1N. Such sub-pixel arrangement may be repeated up to a predetermined row set in advance.

The red sub-pixel Pr and the blue sub-pixel Pb may be alternately arranged in the second direction (the y-direction or the (−) y-direction) on a first column 1M, and the green sub-pixels Pg may be arranged spaced apart from each other with a predetermined interval in the second direction on a second column 2M adjacent to the first column 1M. The blue sub-pixel Pb and the red sub-pixel Pr may be alternately arranged in the second direction on a third column 3M adjacent to the second column 2M. The green sub-pixels Pg may be arranged spaced apart from each other with a predetermined interval in the second direction on a fourth column 4M adjacent to the third column 3M. Such sub-pixel arrangement may be repeated up to a predetermined column set in advance. In this case, the blue sub-pixel Pb and the red sub-pixel Pr are greater than the green sub-pixel Pg. Alternatively, the blue sub-pixel Pb may be greater than the red sub-pixel Pr and the green sub-pixel Pg. Such sub-pixel arrangement is referred to as an RGBG structure.

Since a first area A1-2, a (2-1)st area Aa2-2, a (2-2)nd area Ab2-2, a first red sub-pixel Pr1-2, a first green sub-pixel Pg1-2, a first blue sub-pixel Pb1-2, a second red sub-pixel Pr2-2, a second green sub-pixel Pg2-2, a second blue sub-pixel Pb2-2, the size Wr1-2 of the first red sub-pixel Pr1-2, the size Wr2-2 of the second red sub-pixel Pr2-2, the size Wg1-2 of the first green sub-pixel Pg1-2, the size Wg2-2 of the second green sub-pixel Pg2-2, the size Wb1-2 of the first blue sub-pixel Pb1-2, the size Wb2-2 of the second blue sub-pixel Pb2-2, a first shortest distance dis1-2, and a second shortest distance dis2-2 of FIG. 12 are described similar to the first area A1, the (2-1)st area Aa2, the (2-2)nd area Ab2, the first red sub-pixel Pr1, the first green sub-pixel Pg1, the first blue sub-pixel Pb1, the second red sub-pixel Pr2, the second green sub-pixel Pg2, the second blue sub-pixel Pb2, the size Wr1 of the first red sub-pixel Pr1, the size Wr2 of the second red sub-pixel Pr2, the size Wg1 of the first green sub-pixel Pg1, the size Wg2 of the second green sub-pixel Pg2, the size Wb1 of the first blue sub-pixel Pb1, the size Wb2 of the second blue sub-pixel Pb2, the first distance dis1, and the second distance dis2 of FIG. 6, detailed description thereof is omitted to avoid redundancy.

Figure 13:
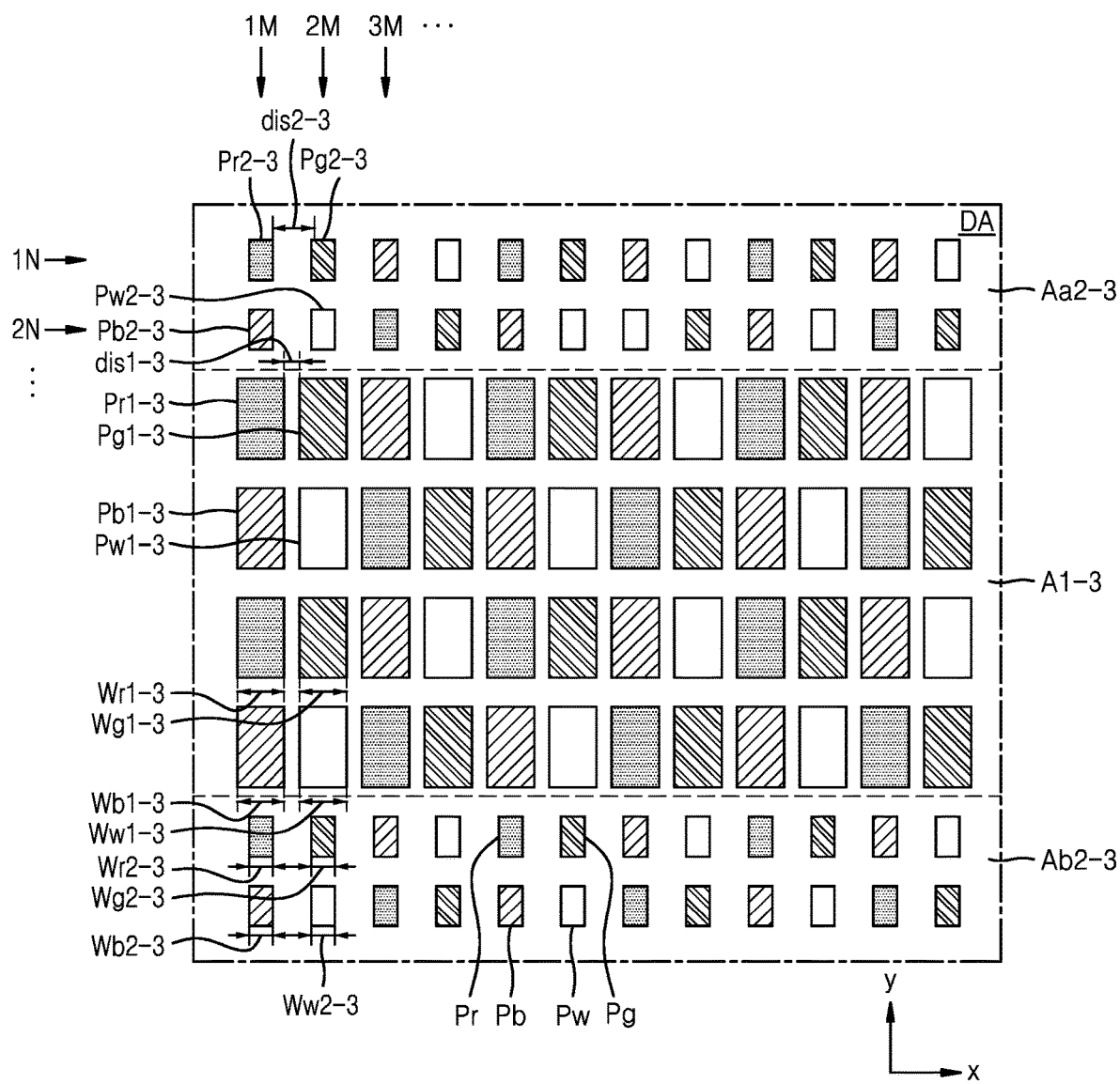
FIG. 13 is a plan view of yet another exemplary embodiment of arrangement of a plurality of sub-pixels in the first and second areas of FIG. 3.

FIG. 13 is a plan view of yet another exemplary embodiment of arrangement of a plurality of sub-pixels in the first and second areas of FIG. 3.

Referring to FIG. 13, a red sub-pixel Pr, a green sub-pixel Pg, a blue sub-pixel Pb, and a white sub-pixel Pw may be alternately arranged in the first direction (e.g. the x-direction or the (−) x-direction) on a first row 1N. The blue sub-pixel Pb, the white sub-pixel Pw, the red sub-pixel Pr, and the green sub-pixel Pg may be alternately arranged on a second row 2N adjacent to the first row 1N. Such sub-pixel arrangement may be repeated up to a predetermined row set in advance.

The red sub-pixel Pr and the blue sub-pixel Pb may be alternately arranged in the second direction (the y-direction or the (−) y-direction) on a first column 1M, and the green sub-pixel Pg and the white sub-pixel Pw may be alternately arranged in the second direction on a second column 2M adjacent to the first column 1M. Such sub-pixel arrangement may be repeated up to a predetermined column set in advance. In this case, the plurality of sub-pixels may be formed in a substantially constant size. Such sub-pixel arrangement is referred to as an RGBW structure.

Since a first area A1-3, a (2-1)st area Aa2-3, a (2-2)nd area Ab2-3, a first red sub-pixel Pr1-3, a first green sub-pixel Pg1-3, a first blue sub-pixel Pb1-3, a second red sub-pixel Pr2-3, a second green sub-pixel Pg2-3, and a second blue sub-pixel Pb2-3, the size Wr1-3 of the first red sub-pixel Pr1-3, the size Wr2-3 of the second red sub-pixel Pr2-3, the size Wg1-3 of the first green sub-pixel Pg1-3, the size Wg2-3 of the second green sub-pixel Pg2-3, the size Wb1-3 of the first blue sub-pixel Pb1-3, the size Wb2-3 of the second blue sub-pixel Pb2-3, a first shortest distance dis1-3, and a second shortest distance dis2-3 of FIG. 13 are described similar to the first area A1, the (2-1)st area Aa2, the (2-2)nd area Ab2, the first red sub-pixel Pr1, the first green sub-pixel Pg1, the first blue sub-pixel Pb1, the second red sub-pixel Pr2, the second green sub-pixel Pg2, the second blue sub-pixel Pb2, the size Wr1 of the first red sub-pixel Pr1, the size Wr2 of the second red sub-pixel Pr2, the size Wg1 of the first green sub-pixel Pg1, the size Wg2 of the second green sub-pixel Pg2, the size Wb1 of the first blue sub-pixel Pb1, the size Wb2 of the second blue sub-pixel Pb2, the first shortest distance dis1, and the second shortest distance dis2 of FIG. 6, detailed description thereof is omitted to avoid redundancy.

The size Ww1-3 of a first white sub-pixel Pw1-3 may be greater than the size Ww2-3 of a second white sub-pixel Pw2-3. Since this is similar to the case where the size Wr1-3 of the first red sub-pixel Pr1-3 is greater than the size Wr2-3 of the second red sub-pixel Pr2-3, detailed description thereof is omitted to avoid redundancy.

Up to now, while the aforementioned display devices have been described by using terms of the size of the first sub-pixel and the size of the second sub-pixel, exemplary embodiments are not limited thereto. For example, it may be understood that the size of the first sub-pixel is the size of an emission area of a first organic light-emitting diode, and the size of the second sub-pixel is the size of an emission area of a second organic light-emitting diode.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a display area having a first area and a second area, and a non-display area having a first non-display area and a second non-display area, the first non-display area being disposed in the first area and including a transmission area; and
a plurality of independent sub-pixels arranged in the display area and including portions of an electrode disposed over the display area,
wherein the plurality of independent sub-pixels includes a first sub-pixel disposed in the first area and a second sub-pixel disposed in the second area to emit light of the same color,
a first portion of the electrode of the first sub-pixel has a thickness different from a thickness of a second portion of the electrode of the second sub-pixel, and
the first sub-pixel has a size different from a size of the second sub-pixel.

2. The display device of claim 1, further comprising a pixel-defining layer,
wherein the electrode comprises an opposite electrode,
the first sub-pixel and the second sub-pixel further comprises pixel electrodes disposed below the opposite electrode,
the pixel-defining layer covers edges of the pixel electrodes and defines openings exposing portions of the pixel electrodes, and
the sizes of the first sub-pixel and the second sub-pixel are defined by the openings.

3. The display device of claim 1, wherein the first area extends in a first direction.

4. The display device of claim 3, wherein the first area is arranged across the second area.

5. The display device of claim 3, wherein the electrode has a thickness in the first area greater than a thickness in the second area.

6. The display device of claim 3, wherein the first area further extends in a second direction intersecting the first direction,
the electrode has a thickness in the first area less than a thickness in the second area.

7. The display device of claim 1, wherein the display area surrounds the first non-display area,
the second non-display area surrounds the display area, and
the first area is arranged between the first non-display area and the second non-display area.

8. The display device of claim 7, wherein the first non-display area includes a first region and a second region, and
the first area is further arranged between the first region and the second region.

9. The display device of claim 1, wherein the plurality of sub-pixels includes at least one red sub-pixel, at least one green sub-pixel, and at least one blue sub-pixel.

10. The display device of claim 9, wherein the plurality of sub-pixels constitutes virtual quadrangles, and
the at least one red sub-pixel, the at least one green sub-pixel, and the at least one blue sub-pixel are arranged at vertices of one of the virtual quadrangles.

11. The display device of claim 9, wherein the plurality of sub-pixels constitutes virtual quadrangles,
the at least one red sub-pixel and the at least one blue sub-pixel are arranged at vertices of one of the virtual quadrangles to face a central point of the one of the virtual quadrangles, and
the at least one green sub-pixel is arranged at the central point of the one of the virtual quadrangles.

12. The display device of claim 9, wherein the plurality of sub-pixels further includes a white sub-pixel,
the plurality of sub-pixels constitutes virtual quadrangles, and
the at least one red sub-pixel, the at least one green sub-pixel, the at least one blue sub-pixel, and the white sub-pixel are arranged at vertices of one of the virtual quadrangles.

13. The display device of claim 9, wherein the red sub-pixel, the green sub-pixel, and the blue sub-pixel are arranged generally in parallel to each other.

14. A display device comprising:
a substrate including a display area having a first area and a second area, and a non-display area having a first non-display area and a second non-display area, the first non-display area being disposed in the first area and including a transmission area; and
a plurality of organic light-emitting diodes arranged in the display area and including portions of an electrode disposed over the display area,
wherein the plurality of organic light-emitting diodes includes a first organic light-emitting diode disposed in the first area and a second organic light-emitting diode disposed in the second area to emit light of the same color,
a first portion of the electrode of the first organic light-emitting diode has a thickness different from a thickness of a second portion of the electrode of the second organic light-emitting diode, and
an emission area of the first organic light-emitting diode has a size different from a size of an emission area of the second organic light-emitting diode.

15. The display device of claim 14, further comprising a pixel-defining layer, and
wherein the electrode comprises an opposite electrode,
the plurality of organic light-emitting diodes each further includes a pixel electrode and an emission layer,
the pixel-defining layer covers edges of the pixel electrodes of the plurality of organic light-emitting diodes to define openings exposing portions of the pixel electrodes, and
emission areas of the plurality of organic light-emitting diodes are defined by the openings.

16. The display device of claim 14, wherein
the first area extends in a first direction to be arranged across the second area.

17. The display device of claim 16, wherein a first portion of the electrode of the first area has a thickness greater than a thickness of a second portion of the electrode of the second area.

18. The display device of claim 16, wherein the first area further extends in a second direction intersecting the first direction extending across the second area, and
- a first portion of the electrode of the first area has a thickness less than a thickness of a second portion of the electrode of the second area.

19. The display device of claim 16, wherein
the display area surrounds the first non-display area,
the second non-display area surrounds the display area, and
the first area is disposed between the first non-display area and the second non-display area.

20. The display device of claim 14, wherein the plurality of organic light-emitting diodes each are configured to emit light having one of red, green, and blue colors, and are arranged in a pentile matrix.

\* \* \* \* \*